(12) United States Patent
Kim et al.

(10) Patent No.: US 10,568,217 B2
(45) Date of Patent: Feb. 18, 2020

(54) DISPLAY DEVICE

(71) Applicant: LG ELECTRONICS INC., Seoul (KR)

(72) Inventors: Hyeonjun Kim, Seoul (KR); Jungkyu Park, Seoul (KR); Sungwook Han, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/870,615

(22) Filed: Jan. 12, 2018

(65) Prior Publication Data
US 2018/0199450 A1 Jul. 12, 2018

(30) Foreign Application Priority Data
Jan. 12, 2017 (KR) .................. 10-2017-0005538

(51) Int. Cl.
| | |
|---|---|
| *H05K 5/00* | (2006.01) |
| *H05K 5/02* | (2006.01) |
| *H05K 7/02* | (2006.01) |
| *H05K 5/06* | (2006.01) |
| *H05K 7/20* | (2006.01) |

(52) U.S. Cl.
CPC ......... *H05K 5/0017* (2013.01); *H05K 5/0213* (2013.01); *H05K 5/06* (2013.01); *H05K 7/02* (2013.01); *H05K 7/20136* (2013.01); *H05K 7/20445* (2013.01)

(58) Field of Classification Search
CPC ............. H05K 7/20972; H05K 5/0213; H05K 7/20145; H05K 7/202; H05K 7/20954; H05K 7/1494; H05K 5/0017; H05K 5/0217; H05K 7/20136; H05K 7/20963; G02F 1/133385; G02F 1/133308; G02F 2201/36; G02F 1/133382; G02F 1/133603; G02F 2001/133314; G02F 2001/133628; G02F 2001/133317; G02F 2001/13332; G06F 1/1601; G06F 1/20; G06F 1/181; G06F 1/206
USPC .... 361/695, 679.21, 679.46, 679.48, 679.47, 361/694; 165/80.3
See application file for complete search history.

(56) References Cited

U.S. PATENT DOCUMENTS

| | | | | |
|---|---|---|---|---|
| 3,422,721 | A | * | 1/1969 | Yonkers ................ F16B 43/001 277/637 |
| 4,771,277 | A | * | 9/1988 | Barbee .................. G06F 3/0414 200/302.1 |
| 5,993,027 | A | * | 11/1999 | Yamamoto ........ G02F 1/133604 362/294 |

(Continued)

OTHER PUBLICATIONS

European Patent Office Application Serial No. 18150539.7, Search Report dated Jun. 14, 2018, 9 pages.

*Primary Examiner* — Mandeep S Buttar
(74) *Attorney, Agent, or Firm* — Lee, Hong, Degerman, Kang & Waimey PC

(57) ABSTRACT

The present invention is a display device comprising: a housing providing an inner space; a plate in the housing, the plate dividing the inner space into a front space and a rear space and including an opening communicating the front space with the rear space; a display module in the front space, the display module mounted on the plate and covering the opening; and an inlet and an outlet formed at the housing, the inlet and the outlet communicating the rear space with an outside of the housing.

11 Claims, 24 Drawing Sheets

(56) References Cited

U.S. PATENT DOCUMENTS

| | | | | |
|---|---|---|---|---|
| 7,385,819 | B1* | 6/2008 | Shives | H05K 7/20963 349/58 |
| 8,035,968 | B2* | 10/2011 | Kwon | H05K 7/20972 165/104.33 |
| 8,953,307 | B2* | 2/2015 | Oh | H04N 5/64 248/81 |
| 2009/0244472 | A1 | 10/2009 | Dunn | |
| 2010/0321887 | A1* | 12/2010 | Kwon | H05K 7/20972 361/695 |
| 2014/0305578 | A1* | 10/2014 | Yang | B32B 37/003 156/249 |
| 2014/0321054 | A1* | 10/2014 | Kaefer | H05K 7/20972 361/692 |
| 2017/0200424 | A1* | 7/2017 | Xu | G09G 3/3225 |
| 2018/0160573 | A1* | 6/2018 | Kim | H05K 7/20963 |

\* cited by examiner

DISPLAY DEVICE

Pursuant to 35 U.S.C. § 119(a), this application claims the benefit of earlier filing date and right of priority to Korean Patent Application No. 10-2017-0005538 filed on Jan. 12, 2017, the contents of which are hereby incorporated by reference herein in its entirety.

BACKGROUND OF THE INVENTION

Field of the Invention

The present invention is related to a display device.

Discussion of the Related Art

With the development of the information society, various demands for display devices have been increasing. Various display devices, such as, e.g., liquid crystal displays (LCDs), plasma display panels (PDPs), electroluminescent displays (ELDs), and vacuum fluorescent displays (VFDs), have been studied and used to meet various demands for the display devices.

The liquid crystal panel of the LCD, may include a TFT substrate and a color filter substrate facing the TFT substrate, and may display an image by using light provided from a backlight unit.

SUMMARY OF THE INVENTION

Accordingly, an object of the present disclosure is to address the above-described and other problems.

The present invention is to solve the above-mentioned problems and other problems. Another object of the present invention is to provide an effective heat dissipation structure of the display device.

Another object of the present invention is to provide a heat dissipation structure making the display module contact with outside air.

Another object of the present invention is to provide a structure for preventing the outside air from being introduced into the display module.

Another object of the present invention is to provide a structure for circulating inside air to dissipate the display module.

Another object of the present invention is to provide a structure in which the inside air and the outside air independently dissipate heat of the display module.

Another object of the present invention is to provide the display device of which structure that is easy to maintain or repair.

Another object of the present invention is to provide the display device of which display module that is easy to be fastened.

Another object of the present invention is to provide a heat dissipation structure which can reduce manufacturing cost of the display device.

Another object of the present invention is to enhance the quality or durability of the display device.

Another object of the present invention is to enhance the convenience of assembly of the display device.

Another object of the present invention is to improve heat dissipation of the display device.

The display device according to an embodiment of the present invention to achieve the above objects may comprise: a housing providing an inner space; a plate installed at the housing, the plate dividing the inner space of the housing into a front space and a rear space, the place including an opening communicating the front space with the rear space; a display module mounted on the plate in the front space, the display module covering the opening; and an inlet and an outlet formed at the housing, the inlet and the outlet communicating the rear space with an outside of the housing.

The display device may further comprise a first fan positioned at the rear space of the housing.

The display device may further comprise: a main frame installed in the rear space of the housing, the main frame spaced apart from the plate; and a first mount connected to a lower portion of the main frame, the first fan may be coupled with the first mount, the outlet may face the first mount.

The display device may further comprise a main frame installed in the rear space, the main frame may be spaced apart from the plate, the inlet may be formed at an upper portion of the main frame, and the inlet may be located between the main frame and the plate.

The display device may further comprise a sealing frame in contact with the display module and the plate, a rear surface of the display module may include a heat exchange region surrounded by the sealing frame, and the heat exchange region may face the opening.

The display device may further comprise a gasket placed between the sealing frame and the plate.

The display module may include: a pem net fastened to the heat exchange region; and a sealing member positioned around the pem nut.

The display device may further comprise a heat transferring pad contacting the rear surface of the display module except the heat exchange region, the heat transferring pad positioned between the display module and the plate.

The display device may further comprise a bracket coupled with the display module and the plate, and the bracket may be located at at least one of an upper side of the display module and a lower portion.

The display device may further comprise: a main frame installed in the rear space of the housing, the main frame providing a second inner space, the main frame dividing the rear space into the second inner space and a intermediate space; and a glass covering a front surface of the housing, the first fan may be positioned in the intermediate space of the housing, the plate may include a first and second holes communicating the front space with the intermediate space, and the main frame may include: a fourth and fifth holes communicating the second inner space with the intermediate space; a first duct connecting the first hole to the fourth hole; a second duct connecting the second hole to the fifth hole; and a second fan positioned in the second inner space of the housing.

The first hole may be located above the display module, the second hole may be located under the display module, and the display module may be positioned between the first hole and the second hole.

Each of the first hole and the second hole may be formed in plurality along an edge of the plate.

The plate may include a third hole communicating the front space with the intermediate space, the main frame may include: a power supply unit mounted on the main frame; a sixth hole communicating the second inner space and the intermediate space; a third duct connecting the third hole to the sixth hole; and a wiring passing through the third duct, the wiring connecting the power supply unit to the display module.

According to at least one of embodiments of the present invention, effective heat dissipation structure of the display device may be provided.

According to at least one of embodiments of the present invention, a structure for effective heat exchange of display module with outside air may be provided.

According to at least one of embodiments of the present invention, manufacturing cost of the display device may be reduced.

According to at least one of embodiments of the present invention, quality or durability of the display device may be enhanced.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
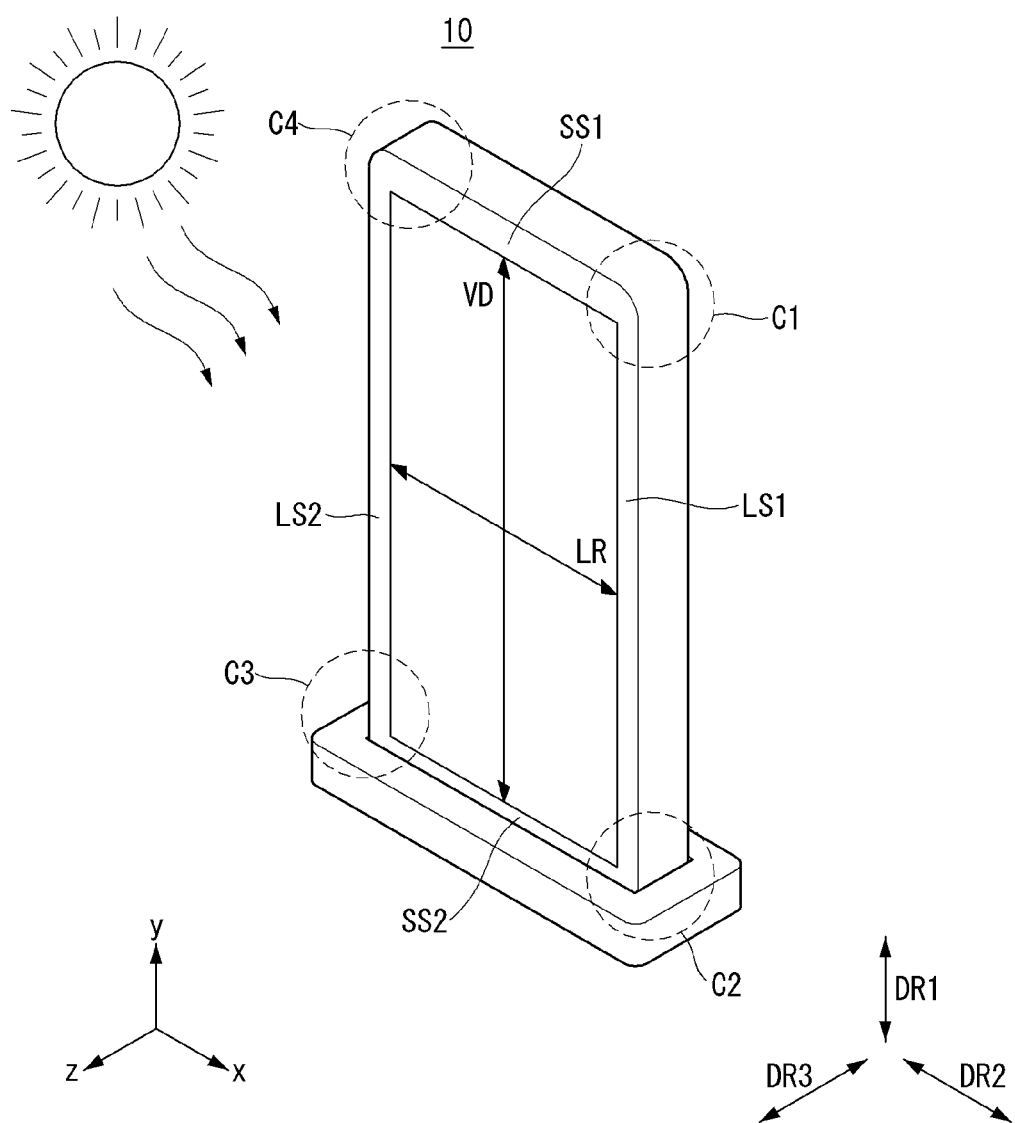
FIGS. 1 to 4 are views showing a display device according to an embodiment of the present invention.

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

Hereinafter, a liquid crystal display device (LCD) will be described as an example of the display panel. However, the display panel applicable to the present invention is not limited to the liquid crystal panel, can be a plasma display panel (PDP), a field emission display (FED), and an organic light emitting diode (OLED).

Referring to FIG. 1, the display device 10 may include a first long side LS1, a second long side LS2 opposite to the first long side LS1, a first short side SS1 connecting the first long side LS1 and the second long side LS2, and a second short side SS2 opposite to the first short side SS1.

The first short side SS1 may be referred to as a first short side area SS1 or a first side area. The second short side SS2 may be referred to as a second short side area SS2 or a second side area. The first long side LS1 may be referred to as a first long side area LS1 or a third side area. The second long side LS2 may be referred to as a second long side area LS2 or a fourth side area.

The lengths of the first and second long sides LS1 and LS2 may be longer than the lengths of the first and second short sides SS1 and SS2 for the convenience of explanation. However, it is also possible that the lengths of the first and second long sides LS1 and LS2 are substantially equal to the lengths of the first and second short sides SS1 and SS2.

A first direction DR1 may be a direction along the long side LS1 and LS2 of the display device 10. A second direction DR2 may be a direction along the short side SS1 and SS2 of the display device 10.

A third direction DR3 may be normal to the first direction DR1 or/and the second direction DR2.

A horizontal direction may stand for at least one of the first direction DR1 and the second direction DR2. The first direction DR1 and the second direction DR2 may be referred to as the horizontal direction. The third direction DR3 may be referred to as a vertical direction.

From another point of view, the side on which the display device 10 displays an image may be referred to as a front or a front side. When the display device 10 displays an image, the side on which the image cannot be observed may be referred to as a rear or a rear side. When the display device 10 is viewed from the front or the front side, the first long side LS1 may be referred to as the right or the right side, the second long side LS2 may be referred to as the left or the left side, the first short side SS1 may be referred to as the upper or the upper side, and the second short side SS2 may be referred to as the lower or the lower side.

The first long side LS1, the second long side LS2, the first short side SS1, and the second short side SS2 may be referred to as an edge of the display device 10. A place where the first long side LS1, the second long side LS2, the first short side SS1, and the second short side SS2 meet with each other may be referred to as a corner. For example, a place where the first long side LS1 and the first short side SS1 meet may be a first corner C1. A place where the first long side LS1 and the second short side SS2 meet may be a second corner C2. A place where the second short side SS2 meets the second long side LS2 may be a third corner C3. A place where the second long side LS2 and the first short side SS1 meet may be a fourth corner C4.

The direction from the first short side SS1 to the second short side SS2 or the direction from the second short side SS2 to the first short side SS1 can be referred to as the up-down direction UD. The direction from the first long side LS1 to the second long side LS2 or the direction from the second long side LS2 to the first long side LS1 may be referred to as the left-right direction LR.

The display device 10 may be installed indoors or outdoors. The display device 10 may be heated by an external heat source such as sunlight. In case that the temperature of the display device 10 rises above a certain temperature, the performance of the display device 10 may deteriorate. Therefore, a proper heat dissipation structure may be required to maintain the performance of the display device 10.

Figure 2:
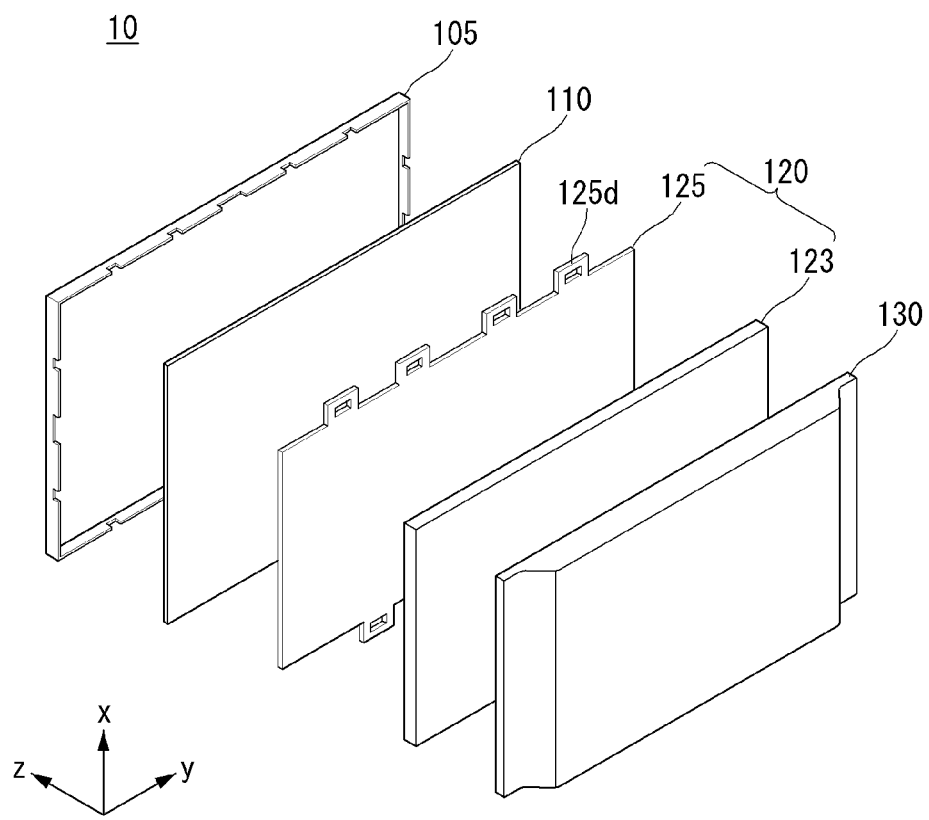
Figure 3:
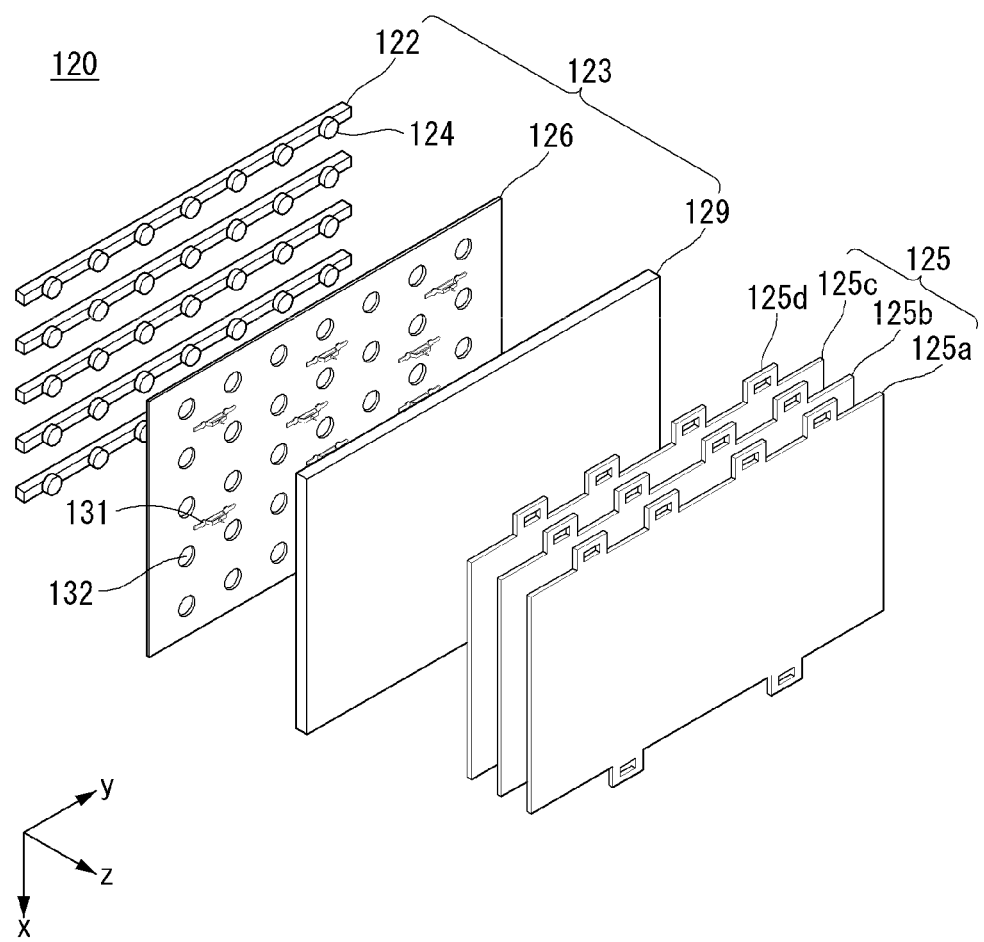

Referring to FIGS. 2 and 3, the display device 10 may include a front cover 105, a display panel 110, a backlight unit 120, and module cover 130.

The front cover 105 may cover at least a part of the front surface and the lateral surface of the display panel 110. The front cover 105 may have a form of a rectangular frame having a hollow center. Since the center of the front cover 105 is empty, the image of the display panel 110 can be displayed externally.

The front cover 105 can be divided into a front side cover and a lateral side cover. The front cover 105 may include a front side cover positioned on the front side of the display panel 110 and a lateral side cover positioned on the lateral side of the display panel 110. The front side cover and the lateral side cover of the front cover 105 can be separately configured. Either the front side cover or the lateral side cover of the front cover 105 may be omitted. For example, it is possible that there is no front side cover of the front cover 105 and only a lateral side cover of the front cover 105 exists.

The display device 10 may include a display panel 110. The display panel 110 may display an image. The display panel 110 may display an image by dividing the image into a plurality of pixels. The display panel 110 can output an image in accordance with the color, brightness, and saturation of each pixel. The display panel 110 may include an active area where an image is displayed and an inactive area where an image is not displayed. The display panel 110 may include a front substrate and a rear substrate opposite to the front substrate with respect to a liquid crystal layer.

The front substrate may include a plurality of pixels. Each of the plurality of pixels may be composed of red (R), green (G), and blue (B) sub-pixels. The front substrate may generate an image corresponding to a red, green, or blue color according to a control signal.

The rear substrate may include switching elements. The rear substrate can switch the pixel electrodes. For example, the pixel electrode can change the molecular arrangement of the liquid crystal layer according to the control signal applied from the outside. The liquid crystal layer may include a plurality of liquid crystal molecules. The liquid crystal molecules can change the arrangement in accordance with the voltage difference between the pixel electrode and the common electrode. The liquid crystal layer can transmit the light provided from the backlight unit 120 to the front substrate.

The backlight unit 120 may be positioned on the rear of the display panel 110. The backlight unit 120 may include a plurality of light sources. The light source of the backlight unit 120 may be arranged in a direct type.

The backlight unit 120 may be coupled to the front side of the frame. For example, a plurality of light sources may be disposed on the front side of the frame, and in such a case, the backlight unit 120 may be referred to as a direct type backlight unit.

The backlight unit 120 may be driven by a whole driving method or a partial driving method such as local dimming, impulsive, or the like. The backlight unit 120 may include an optical sheet 125 and an optical layer 123.

The optical sheet 125 may allow light from the light source to be uniformly transmitted to the display panel 110. The optical sheet 125 may be composed of a plurality of layers. For example, the optical sheet 125 may include at least one prism sheet and/or at least one diffusion sheet.

The optical sheet 125 may have at least one engaging portion 125d. The engaging portion 125d can be engaged with the front cover 105 and/or the module cover 130. The engaging portion 125d can be coupled to the front cover 105 and/or the structure coupled onto the module cover 130. The engaging portion 125d may be indirectly coupled to the front cover 105 and/or the module cover 130.

The optical layer 123 may include a light source or the like. The specific configuration of the optical layer 123 will be described later.

The module cover 130 may serve to support the components of the display device. For example, a component such as the backlight unit 120 may be coupled to the frame. The frame may be made of a metal such as an aluminum alloy.

The module cover 130 may be located at the rear portion of the display device. The module cover 130 can protect the components from the outside. At least a portion of the module cover 130 may be coupled to the front cover 105. The module cover 130 may be an injection-molded resin.

The optical sheet 125 and/or the diffuser plate 129 may be positioned above the frame. The optical sheet 125 and/or the diffuser plate 129 may be coupled with the frame at the edge of the frame. The optical sheet 125 and/or the diffuser plate 129 can be directly seated on the edge of the frame. The outer circumference of the optical sheet 125 and/or the diffusion plate 129 can be supported by the frame.

The display panel 110 may be positioned on the front side of the optical sheet 125.

An edge region of the front surface of the display panel 110 may be surrounded by the front cover 105. For example, the display panel 110 can be positioned between the module cover 130 and the front cover 105.

The backlight unit 120 may include an optical layer 123 and an optical sheet 125. The optical sheet 125 may be positioned in front of the optical layer 123. The optical layer 123 may include a substrate 122, at least one optical assembly 124, a reflective sheet 126, and a diffuser plate 129.

The substrate 122 may be configured as a plurality of straps extending in a first direction and spaced a certain distance in a second direction orthogonal to the first direction.

The at least one optical assembly 124 may be mounted on the substrate 122. The substrate 122 may be formed with an electrode pattern for connecting the adapter and the optical assembly 124. For example, a carbon nanotube electrode pattern may be formed on the substrate 122 to connect the optical assembly 124 and the adapter.

The substrate 122 may be composed of at least one of polyethylene terephthalate (PET), glass, polycarbonate (PC), and silicon. The substrate 122 may be a printed circuit board (PCB) on which at least one optical assembly 124 is mounted.

On the substrate 122, the optical assembly 124 may be disposed with a predetermined interval in the first direction. The diameter of the optical assembly 124 may be greater than the width of the substrate 122. For example, the diameter of the optical assembly 124 may be greater than the width of the substrate 122 in the second direction of the substrate 122.

The optical assembly 124 may be a light emitting diode (LED) chip or a light emitting diode package including at least one light emitting diode chip.

The optical assembly 124 may be comprised of a colored LED or a white LED. The colored LED may emit at least one of the colors, such as red, blue, green, and the like. The colored LED may include at least one of a red LED, a blue LED, and a green LED.

The light source included in the optical assembly 124 may be a COB (Chip On Board) type. The COB type may be a form in which the LED chip, which is a light source, is directly coupled to the substrate 122. Therefore, the process can be simplified. In addition, the electric resistance can be lowered, thereby reducing energy lost by heat. That is, the power efficiency of the optical assembly 124 can be increased. The COB type can provide a brighter light. The COB type can be thinner and lighter than the conventional one.

On the front side of the substrate 122, a reflective sheet 126 may be located. The reflective sheet 126 may be located on an area other than the area where the optical assembly 124 of the substrate 122 is formed. That is, it means that a plurality of through holes 132 may be formed in the reflective sheet 126.

The reflective sheet 126 may reflect light emitted from the optical assembly 124 toward the front side of the reflective sheet 126. Further, the reflection sheet 126 can reflect the light reflected from the diffusion plate 129 again.

The reflective sheet 126 may include materials having high reflectivity. For example, the reflective sheet 126 may include at least one of a metal and a metal oxide. Specifically, the reflective sheet 126 may include at least one of aluminum (Al), silver (Ag), gold (Au), and titanium dioxide (TiO2).

The reflective sheet 126 may be formed by depositing and/or coating a metal or metal oxide on the substrate 122. The reflective sheet 126 may be printed with an ink containing a metal material. The reflective sheet 126 may be formed with a vapor deposition layer using a vacuum deposition method such as a thermal evaporation method, an evaporation method, or a sputtering method. A coating layer and/or a printing layer using a printing method, a gravure coating method, or a silk screen method may be formed on the reflective sheet 126.

An air gap may be positioned between the reflective sheet 126 and the diffusion plate 129. The air gap may serve as a buffer through which the light emitted from the optical assembly 124 can spread widely. In order to maintain the air gap, a supporter 131 may be positioned between the reflective sheet 126 and the diffuser plate 129.

Resins can be deposited on the optical assembly 124 and/or the reflective sheet 126. The resin may serve to diffuse the light emitted from the optical assembly 124. The diffuser plate 129 can diffuse the light emitted from the optical assembly 124 forward.

The optical sheet 125 may be positioned on the front side of the diffuser plate 129. The rear surface of the optical sheet 125 may be in close contact with the diffuser plate 129. The front surface of the optical sheet 125 may be in close contact with the rear surface of the display panel 110.

The optical sheet 125 may include at least one sheet 125a, 125b, 125c. In detail, the optical sheet 125 may include one or more prism sheets and/or one or more diffusion sheets. The plurality of sheets 125a, 125b, 125c contained in the optical sheet 125 may be in an adhered and/or adhered state.

The optical sheet 125 may be composed of a plurality of sheets having different functions. For example, the optical sheet 125 may include first to third optical sheets 125a to 125c. The first optical sheet 125a has the function of a diffusing sheet and the second and third optical sheets 125b and 125c can function as a prism sheet. The number and/or position of the diffusion sheet and the prism sheet can be changed. For example, the optical sheet 125 may include a first optical sheet 125a, which is a diffusion sheet, and a second optical sheet 125b, which is a prism sheet.

The diffusion sheet can prevent the light coming from the diffusion plate 129 from being partially densely packed, thereby making the light distribution more uniform. The prism sheet can condense the light coming from the diffusion sheet and allow light to enter the display panel 110 vertically.

The engaging portion 125d may be formed on at least one of the corners of the optical sheet 125. The engaging portion 125d may be formed on at least one of the first to third optical sheets 125a to 125c.

The engaging portion 125d may be formed at an edge of the optical sheet 125. The engaging portion 125d formed on the edge of the first long side and the engaging portion 125d formed on the edge of the second long side may be asymmetric, in terms of location or number.

Figure 4:
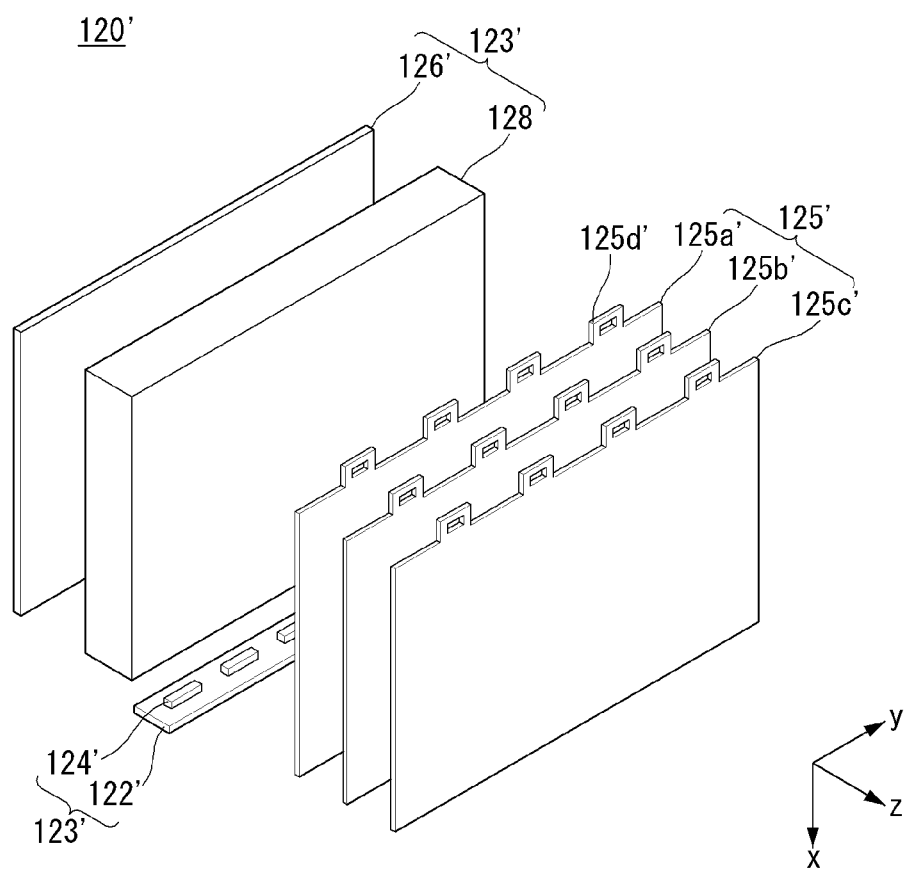

Referring to FIG. 4, the light source of the backlight unit 120 may be arranged in an edge type. The backlight unit 120 may include an optical layer 123 and an optical sheet 125. The optical layer 123 may include a substrate 122, at least one optical assembly 124, a reflective sheet 126, and a light guide plate 128. The optical sheet 125 may be located on the front side of the optical layer 123.

The substrate 122 may be located on at least one side of the other element of the optical layer 123. The substrate 122 may extend in the width direction of the optical layer 123.

The optical assembly 124 may be disposed on the substrate 122 at predetermined intervals. The longitudinal width of the optical assembly 124 may be smaller than the thickness of the light guide plate 128. Therefore, most of the light emitted from the optical assembly 124 can be transmitted into the light guide plate 128.

The light guide plate 128 can be positioned in front of the optical assembly 124. The light guide plate 128 may serve to spread light incident from the optical assembly 124 widely. Although not shown, the light guide plate 128 may have a stepped surface adjacent to the optical assembly 124.

The lower surface of the light guide plate 128 may be inclined upward and can reflect the light incident from the optical assembly 124 forward.

The reflective sheet 126 may be positioned behind the light guide plate 128. The reflective sheet 126 may reflect light emitted from the optical assembly 124 forward. The reflective sheet 126 can reflect the light incident from the light guide plate 128 forward.

A diffuser plate 129 (not shown) may be further provided on the front surface of the light guide plate 128. The diffuser plate 129 can diffuse the light emitted from the light guide plate 128 forward.

Between the light guide plate 128 and the optical sheet 125, an air gap may be located. The air gap may serve as a buffer through which the light emitted from the optical assembly 124 can spread widely. On the other hand, a resin can be deposited on the optical assembly 124 and/or the reflective sheet 126. The resin may serve to diffuse the light emitted from the optical assembly 124.

The optical sheet 125 may be positioned in front of the light guide plate 128. The rear surface of the optical sheet 125 may be in close contact with the light guide plate 128. The front surface of the optical sheet 125 may be in close contact with the rear surface of the display panel 110.

The diffusion sheet can prevent the light coming from the light guide plate 129 from being partially densely packed, thereby making the light distribution more uniform. The prism sheet can condense the light coming from the diffusion sheet and allow light to enter the display panel 110 vertically.

The engaging portion 125d may be formed on at least one of the corners of the optical sheet 125. The engaging portion 125d may be formed on at least one of the first to third optical sheets 125a to 125c.

The engaging portion 125d may be formed at an edge of the optical sheet 125. The engaging portion 125d formed on the edge of the first long side and the engaging portion 125d formed on the edge of the second long side may be asymmetric, in terms of location or number.

Figure 5:
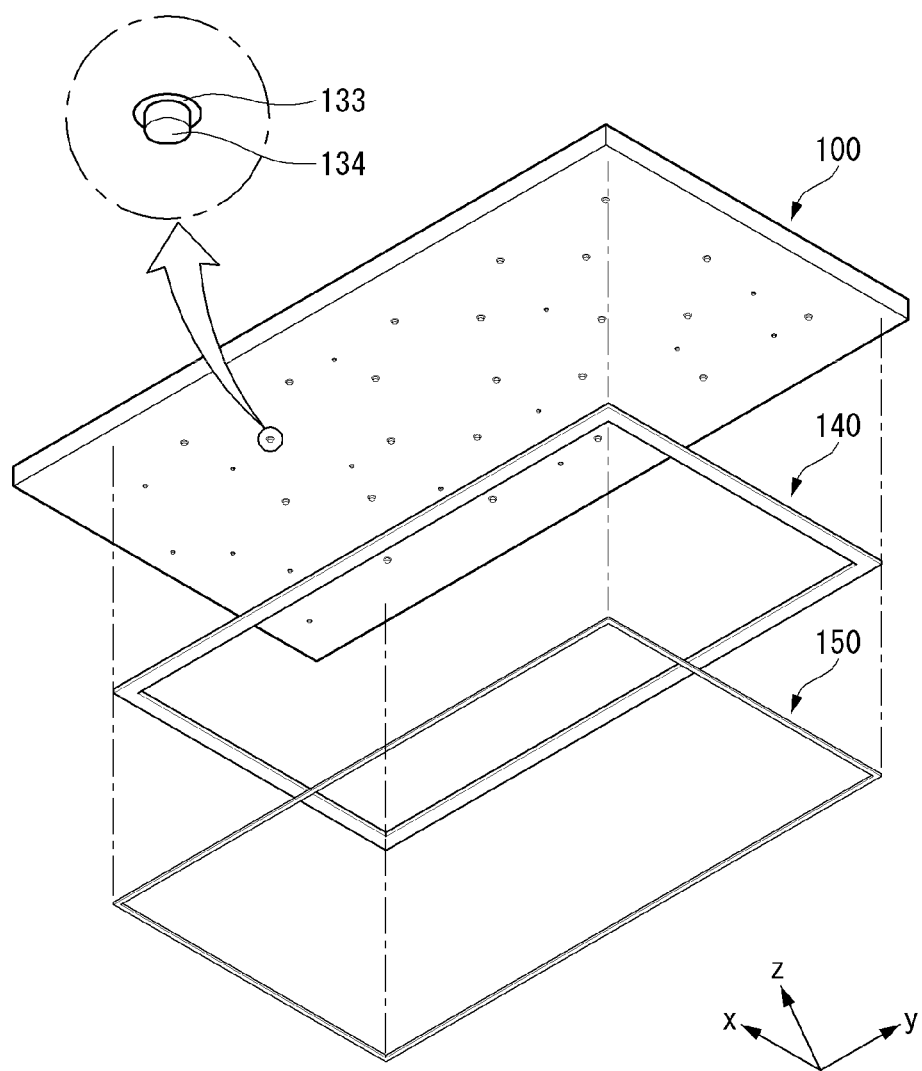
FIGS. 5 to 19 are views showing a configuration of a display device according to an embodiment of the present invention.
Figure 6:
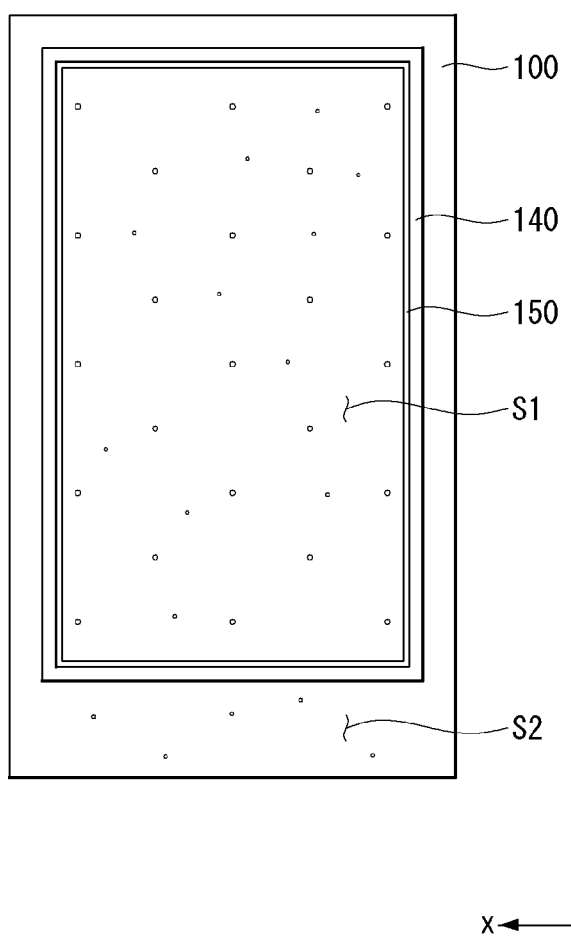

Referring to FIGS. 5 and 6, the sealing frame 140 may be coupled to the rear surface of the display module 100.

The display module 100 may be a heat source. For example, the light source in the display module 100 may be a heat source.

The display module 100 can absorb heat provided from the outside of the display device 10. For example, the display module 100 may be a heat absorber which absorbs solar heat from the sun.

When the temperature of the display module 100 increases to a certain level or higher, the display module 100 may be degraded in display function. Therefore, it may be necessary to properly dissipate the heat of the display module 100 in order to maintain the performance of the display device.

The display device 10 can introduce outside air into the interior of the display device. The outside air introduced into the display device can exchange heat with the heat source inside the display device. The outdoor air can exchange heat with the rear surface of the display module 100. The outside air introduced into the display device 10 can be discharged to the outside of the display device 10 after heat exchange.

The sealing frame 140 may have a rectangular shape. The sealing frame 140 may be formed of a plurality of frames. For example, the rectangular shaped sealing frame 140 may be formed of four frames constituting each side.

The sealing frame 140 may include a fastening surface to be fastened to the rear surface of the display module 100 and a lateral surface to be bent backward of the display module 100 at the fastening surface. The lateral surface can extend along the fastening surface and form a quadrangle. The fastening surface and the rear surface of the display module 100 may be fastened by a fastening member and the fastening member may be located outside a quadrangle formed by the lateral surface.

The sealing frame 140 can compart the rear surface of the display module 100 into a first region S1 and a second region S2. The first region S1 may be inside the sealing frame 140. The second region S2 may be outside the sealing frame 140. The first region S1 on the rear surface of the display module 100 may be an area surrounded by the sealing frame 140. The second region S2 on the rear surface of the display module 100 may be an area excluding the first region S1. The first region S1 may be a part of the rear surface of the display module 100.

The outside air flowing into the display device 10 can exchange heat with the first region S1 of the rear surface of the display module 100. The first region S1 of the rear surface of the display module 100 can be in contact with the outside air. The second region S2 of the rear surface of the display module 100 may be cut off from the outside air. The sealing frame 140 can prevent the outside air from flowing into the second region S2 of the rear surface of the display module 100. The second region S2 of the rear surface of the display module 100 may be referred to as a heat exchange region.

A plurality of fastening members may be disposed on the rear surface of the display module 100. The fastening member may be composed of a bolt and a nut. In this case, a part of the nut and the bolt may be exposed toward the rear of the display module 100.

When a part of the nut and bolt is exposed to the outside of the display module 100, a gap may be generated between the nut and the bolt. The inside of the display module 100 can communicate with and the outside of the display module 100 through the gap between the nut and the bolt.

When the nut and the bolt are exposed to the outside of the display module 100, a gap may be generated between the nut and the rear surface of the display module 100. The inside of the display module 100 can communicate with and the outside of the display module 100 through the gap between the nut and the rear surface of the display module 100.

The outside air introduced into the display device may contain foreign substances such as moisture and dust. In case that the nuts and bolts are exposed to the rear of the display module 100, foreign substances may be penetrated into the display module 100 through the gap between the nuts and the bolts or between the nuts and the rear surface of the display module 100.

In order to prevent foreign matter from penetrating into the display module 100, a pem nut 134 may be used instead of a general nut. An end of the pem nuts 134 may be closed. The pem nuts 134 may extend rearward from the rear surface of the display module 100. In case that the pem nut 134 is fastened to the bolt, one end of the bolt can be covered. Therefore, the gap between the nut and the bolt may not be exposed to the outside. The pem nut 134 may be a kind of a swage nut 134.

The display module 100 may include a sealing member 133. The sealing member 133 may be disposed between the nut and the rear surface of the display module 100. The sealing member 133 may be disposed along the periphery of the nut. The sealing member 133 can prevent foreign matter from penetrating into the display module 100.

The gasket 150 may be disposed on the rear surface of the display module 100. The gasket 150 may be coupled with the sealing frame 140. The gasket 150 may have a quadrangle shape. The gasket 150 may be resilient or elastic.

The gasket 150 and the sealing frame 140 can compart the rear surface of the display module 100 into a first region S1 and a second region S2. The first region S1 may be inside of the gasket 150. The second region S2 may be outside of the sealing frame 140. The gasket 150 can prevent the outside air flowed into the display device from flowing into the second region S2. The gasket 150 and the sealing frame 140 can form a double waterproof and dustproof structure.

Figure 7:
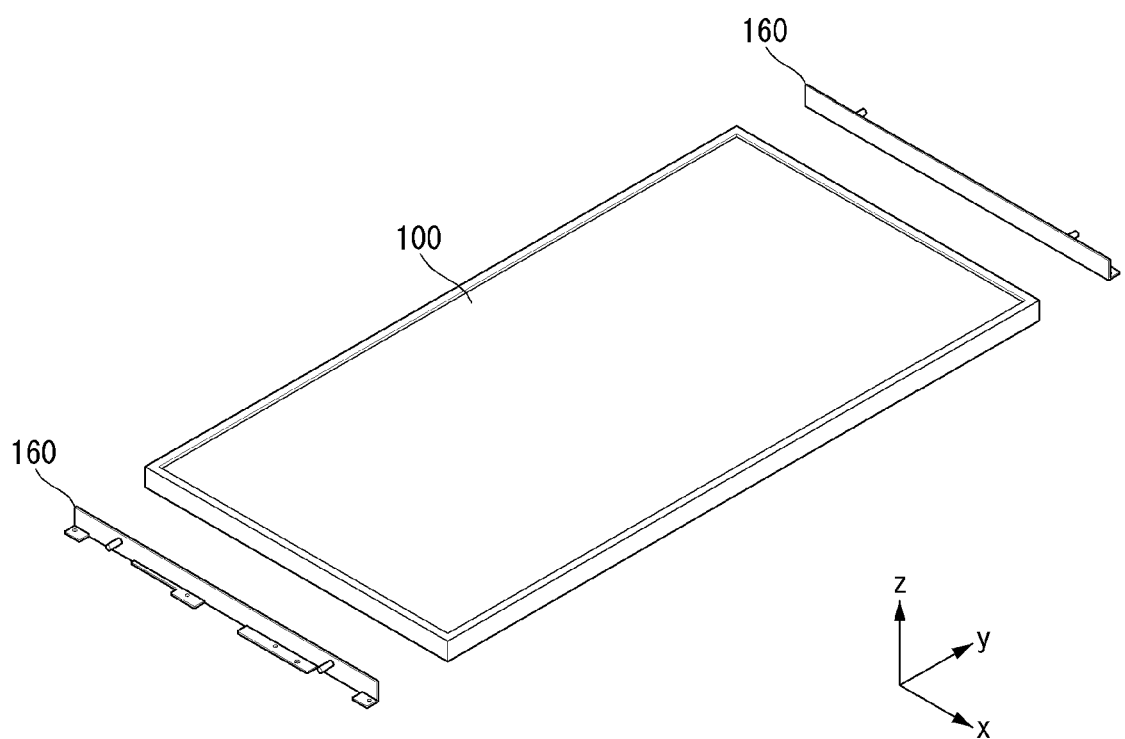

Referring to FIG. 7, the display module 100 may be fastened to the bracket 160. The brackets 160 may be a pair. The pair of brackets 160 may be coupled to a side and another side of the display module 100, respectively.

The display module 100 may be seated on the seating plate 280. The display module 100 is seated on the seating plate 280, and then the bracket 160 can be fastened to the seating plate 280. The seating plate 280 will be described later.

The display module 100 may be coupled to an element such as a sealing frame 140, a gasket 150, or a bracket 160, or the like. In case that the display module 100 is combined with those elements, the display module 100 and those elements may be referred to as a module assembly as a whole. Alternatively, the display module 100 may be referred to as a module assembly.

Figure 8:
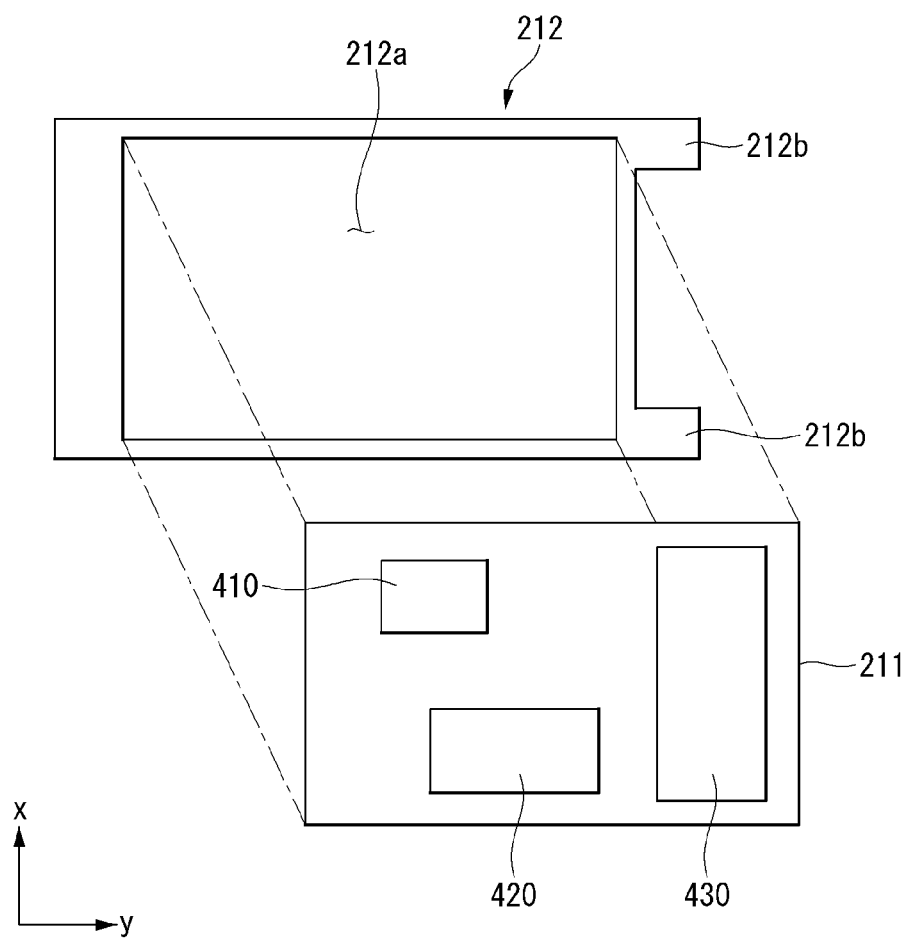
Figure 9:
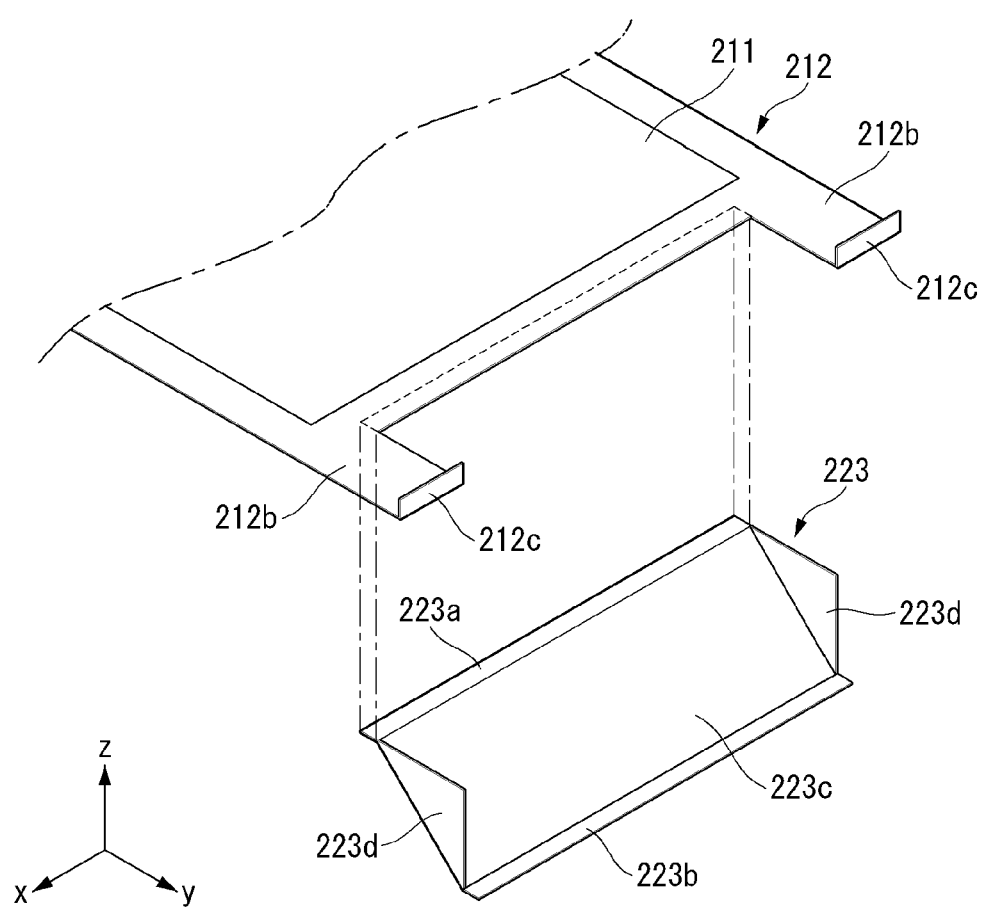

Referring to FIGS. 8 and 9, the guide plate 211 can be fastened to the guide mount 212.

An electronic component can be coupled to the rear surface of the guide plate 211. The electronic component may be, for example, a power supply unit 410, a timing control board 420, or a driver 430.

The guide mount 212 may include an opening 212a. The guide plate 211 can be fastened to the guide mount 212 and the guide plate 211 can cover the opening 212a. The guide mount 212 may be disposed so as to surround the guide plate 211. The guide plate 211 and the guide mount 212 can be fastened by a fastening member.

The guide mount 212 may further include an extension portion 212b and a guide wall 212c. The extension portion 212b may be formed on a side of the guide mount 212. The extension portions 212b can be formed in plural and the plurality of extension portions 212b can be spaced apart from each other. The guide wall 212c may be bent forward from the guide mount 212 at an end of the extended portion 212b.

The guide mount 212 can be fastened to the first guide bracket 223. The first guide bracket 223 may be coupled to the rear surface of the guide mount 212. The first guide bracket 223 may include a coupling surface 223a to be coupled to the guide mount 212, a bottom surface 223b to be spaced apart rearward from the coupling surface, and an inclined surface 223c connecting the coupling surface and the bottom surface 223b. The bottom surface 223b may be spaced apart from the guide mount 212 rearward. The bottom surface 223b may be spaced apart from the guide plate 211 rearward. The first guide bracket 223 may further include a lateral surface 223d. The lateral surface 223d may be connected to the bottom surface 223b and the inclined surface 223c. The lateral surface 223d of the first guide bracket 223 can be disposed in contact with the rear surface of the guide mount 212.

Figure 10:
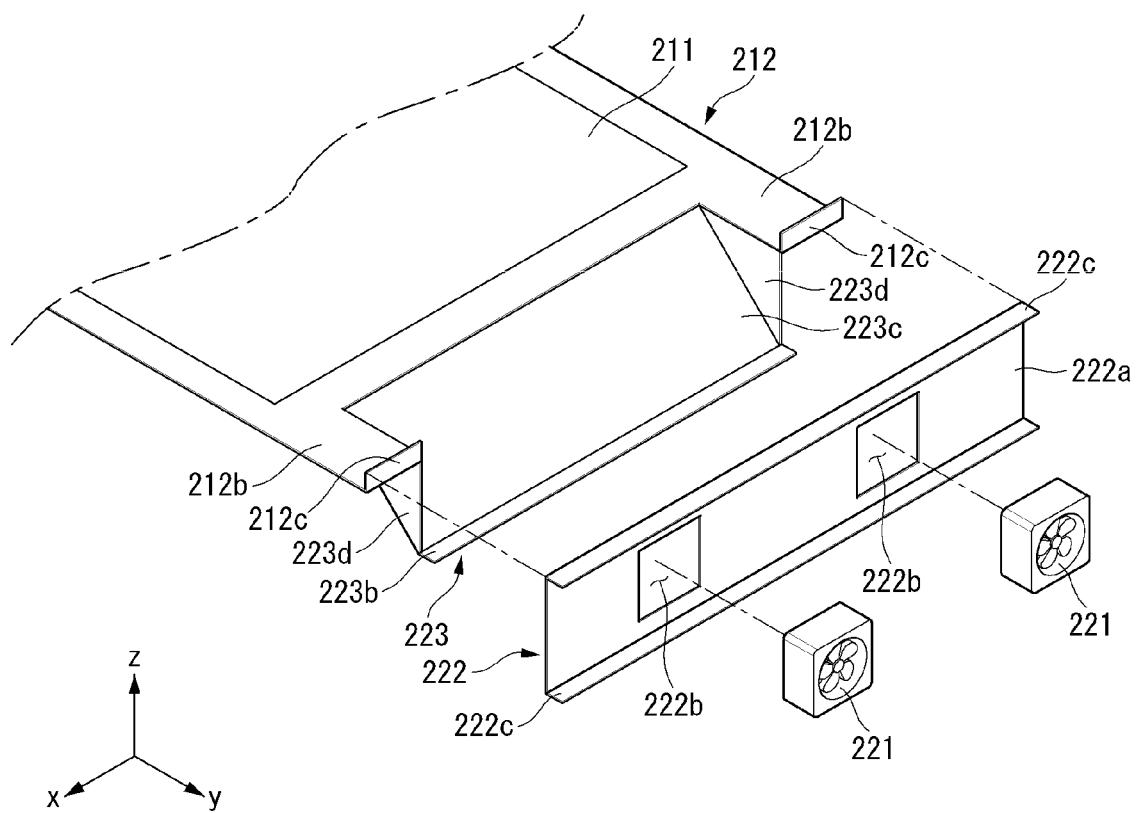
Figure 11:
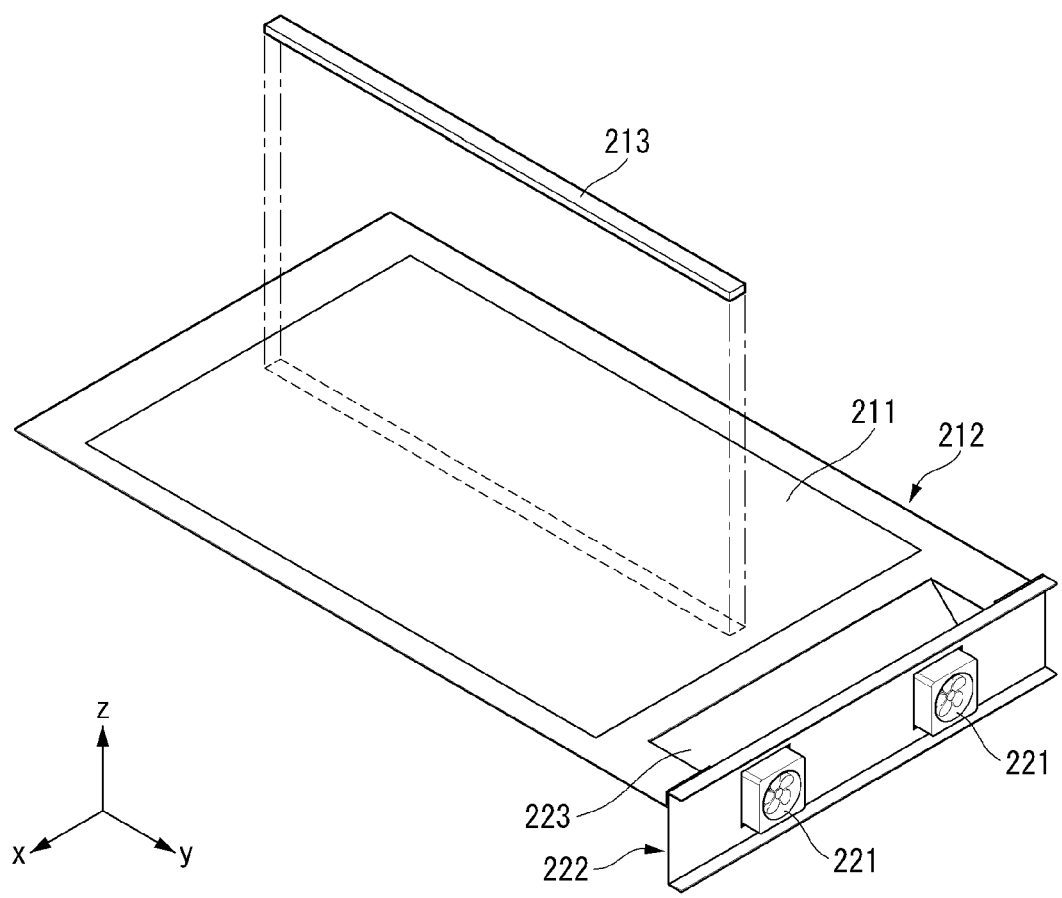
Figure 12:
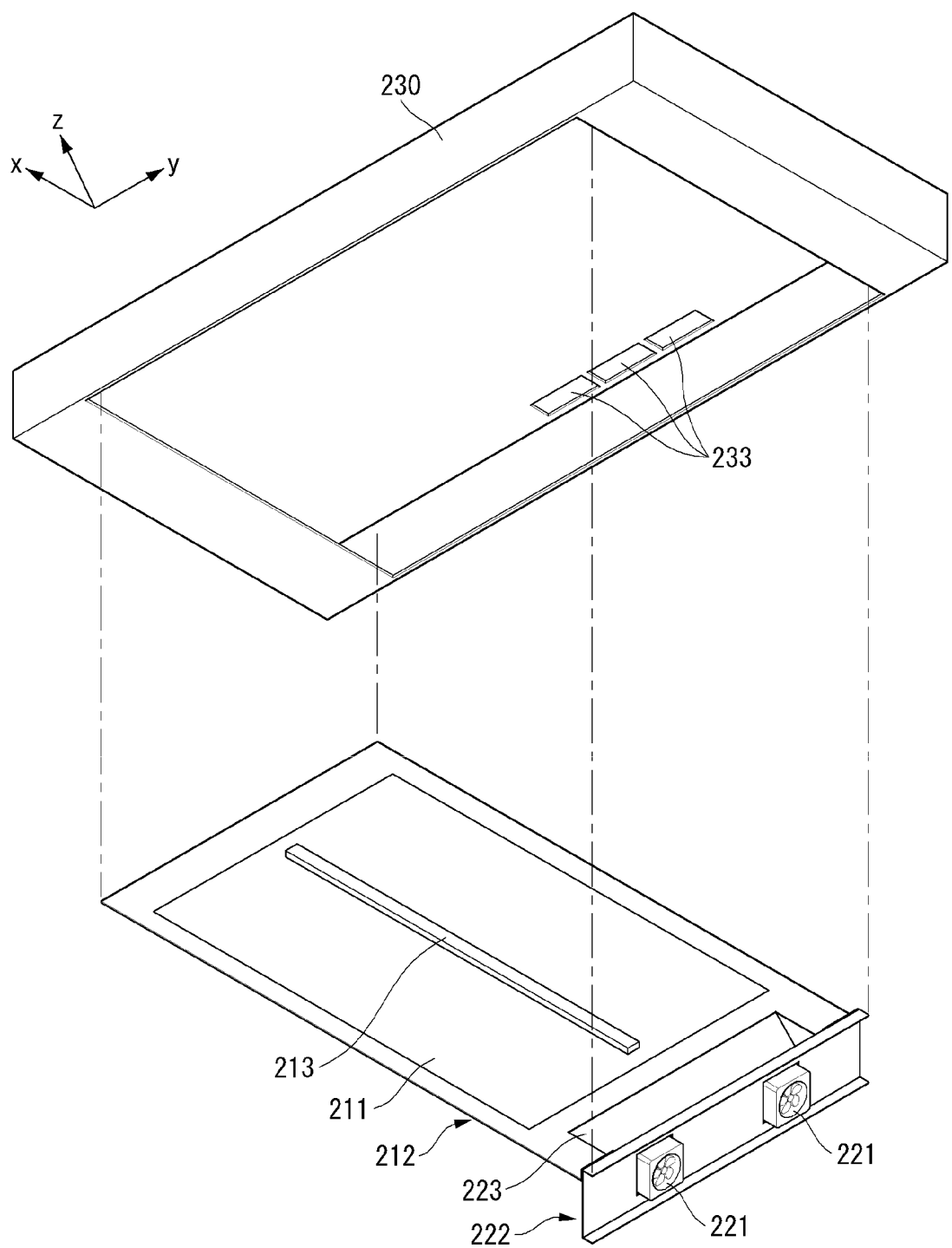
Figure 13:
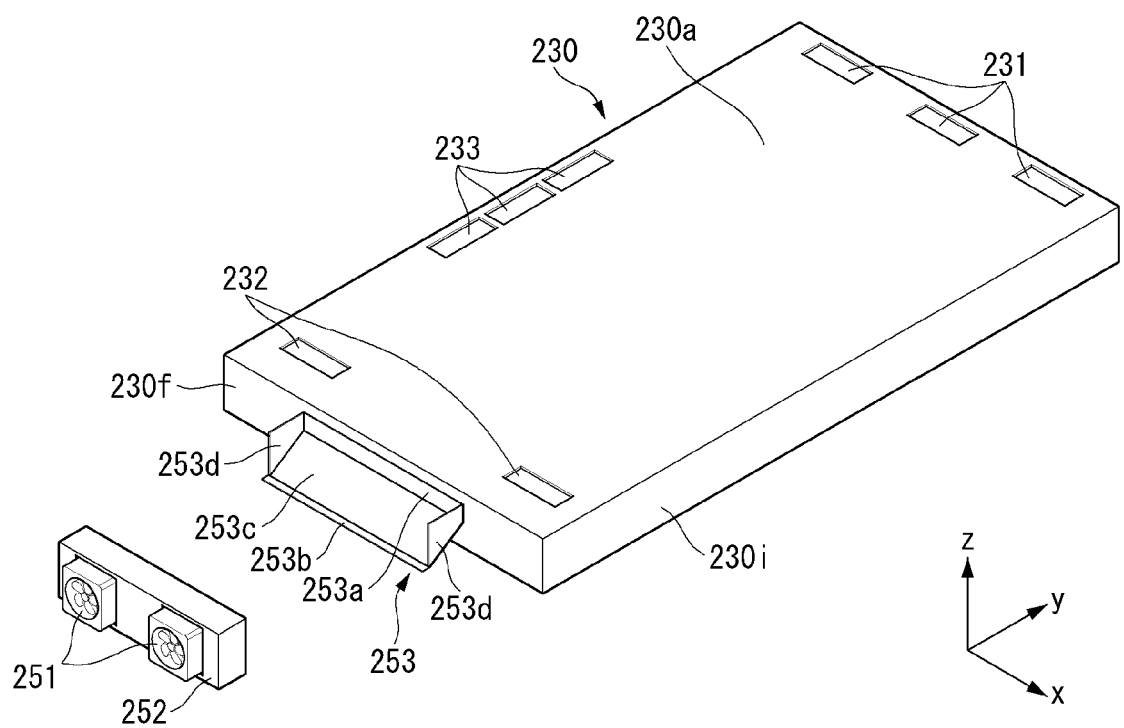
Figure 14:
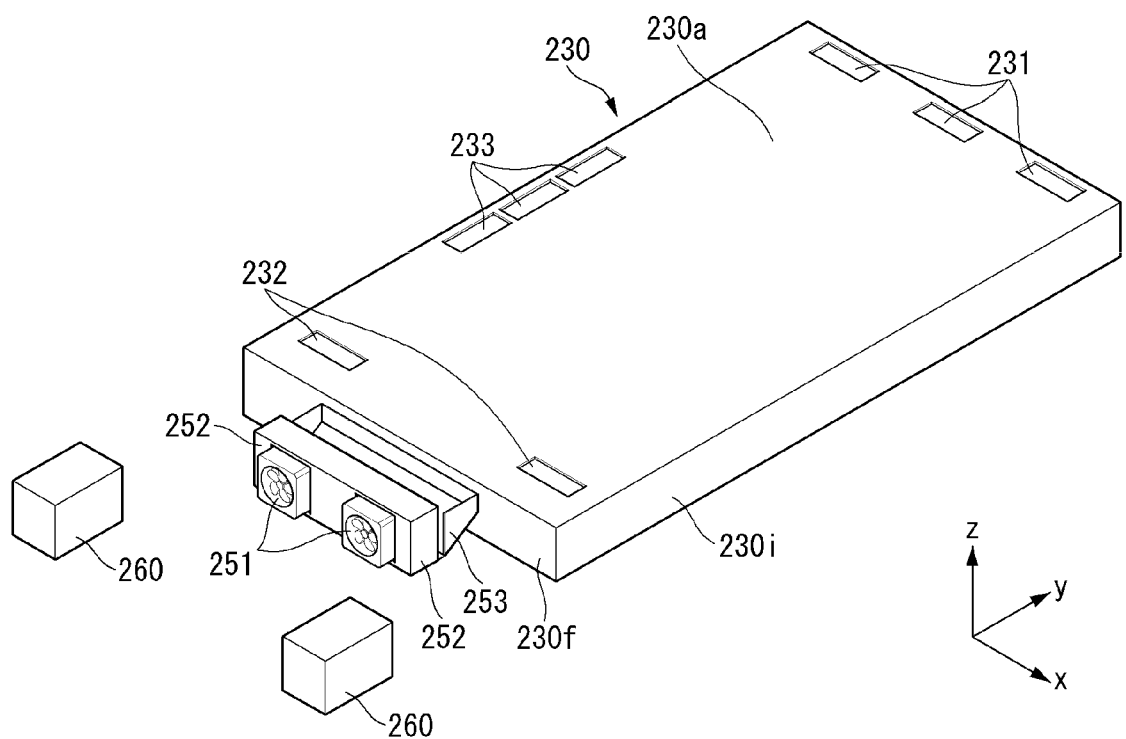
Figure 15:
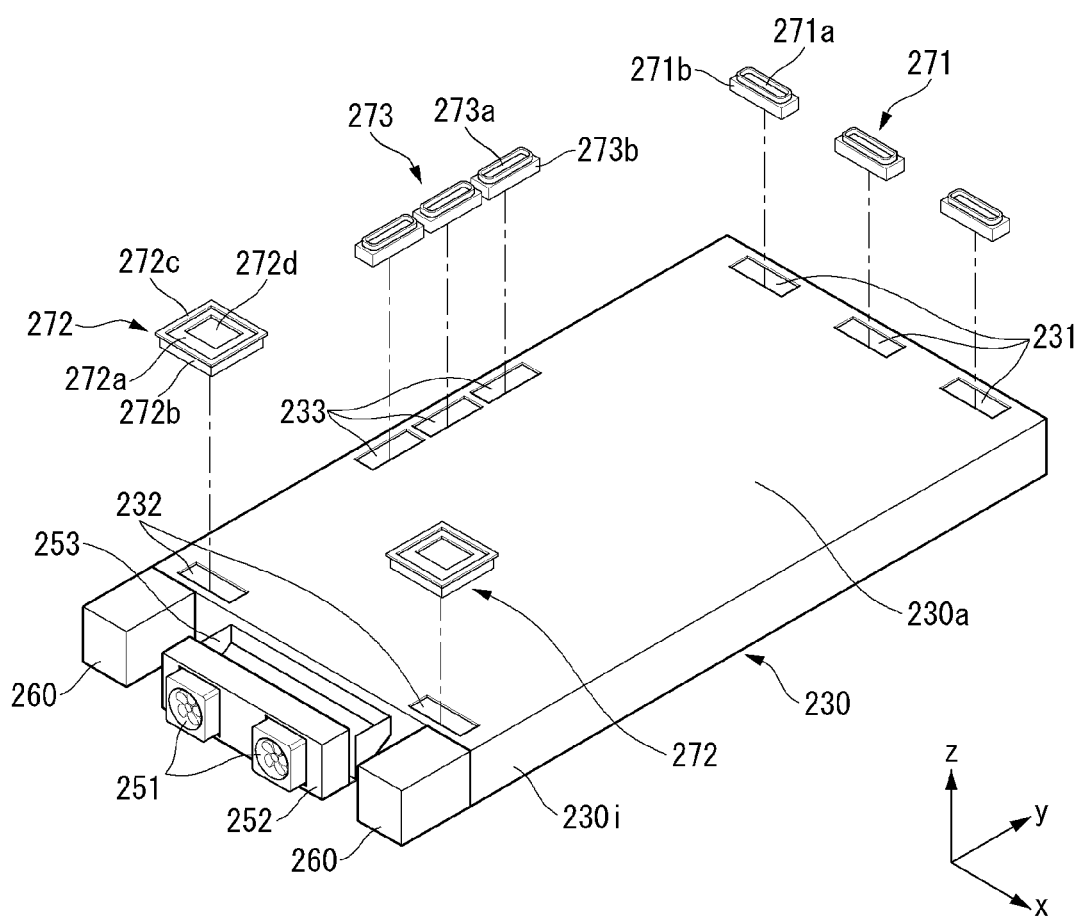

Referring to FIGS. 10 and 11, the guide mount 212 can be fastened to the circulating fan mount 222. The circulating fan 221 can be fastened to the circulating fan mount 222.

The circulating fan mount 222 may include a fastening plate 222a. The circulating fan mount 222 may include a front coupling plate 222c bent upward from the front of the fastening plate 222a. The circulating fan mount 222 may include a rear coupling plate 222d bent upward from the rear of the fastening plate 222a.

The circulating fan 221 may be referred to as a second fan. The circulating fan mount 222 may be referred to as a second fan mount.

The fastening plate 222a can be fastened to the guide wall 212c of the guide mount 212. The fastening plate 222a can be fastened to and the guide wall 212c by the fastening member.

The fastening plate 222a may include a inlet port 222b. The circulating fan 221 can be fastened to the fastening plate 222a. The circulation fan 221 may be arranged to face the inlet port 222b. The circulating fan 221 may be an axial flow fan. The inlet ports 222b may be formed in plural on the fastening plate 222a, and the inlet ports 222b may be spaced apart from each other. The circulation fans 221 may be provided in a plurality corresponding to the inter ports 222b. In case that the fastening plate 222a and the guide mount 212 are fastened together, the inlet port 222b may be arranged to face the inclined surface 223c of the first guide bracket 223.

The fastening plate 222a may be disposed perpendicularly to the guide mount 212. The fastening plate 222a may be disposed perpendicularly to the guide plate 211. The fastening plate 222a may be disposed perpendicularly to the bottom surface 223b of the first guide bracket 223.

The guide plate 211 can be fastened to the spacer 213. The spacer 213 may be disposed on the front surface of the guide plate 211. The spacer 213 may have shape of a rod and may be elongated in the longitudinal direction. The spacer 213 may be arranged to be parallel to the longitudinal direction of the guide plate 211. The spacer 213 may be arranged to be parallel to the longitudinal direction of the guide mount 212.

Referring to FIGS. 12 to 15, the guide mount 212 may be fastened to the main frame 230. The main frame 230 may include a front surface 230a, a rear surface 230b, an upper surface, a lower surface 230f, and a lateral surface. The lateral surface may include a left surface and a right surface 230i. The main frame 230 may have a rectangular parallelepiped shape. Alternatively, the main frame 230 may have a rectangular parallelepiped shape in which a part of the rear surface 230b is removed. Alternatively, the main frame 230 may have a rectangular parallelepiped shape having an opening formed in the rear surface 230b. Alternatively, the main frame 230 may have a hollow rectangular parallelepiped shape. The main frame 230 may form a space therein. The space formed by the main frame 230 can be referred to as a second inner space.

The main frame 230 may include a plurality of holes at the front surface 230a. The main frame 230 may include a fourth hole 231 formed on the front surface 230a. The fourth holes 231 may be formed in plural along an edge of the front surface 230a. The flow or fluid discharged from the circulating fan 221 can pass through the fourth holes 231.

The main frame 230 may include a fifth hole 232 formed on a lower portion of the front surface 230a. The fifth holes 232 may be formed in plural along an edge of the front surface 230a. The flow or fluid passing through the fifth holes 232 may flow into the circulating fan 221.

The main frame 230 may include a sixth hole 233 formed on the front surface 230a. The sixth holes 233 may be formed in plural along an edge of the front surface 230a. The wiring connecting the display module 100 and the electronic components to be fastened to the guide plate 211 can pass through the sixth holes 233.

The rear surface 230b of the main frame 230 may include a lower rear surface 230d positioned on the lower portion of the rear surface 230b and an upper rear surface 230c positioned on the upper portion of the rear surface 230b. An opening may be formed between the upper rear surface 230c and the lower rear surface 230d.

When the guide mount 212 and the main frame 230 are fastened together, the spacer 213 may be in contact with the front surface 230a of the main frame 230. The spacer 211a may be disposed between the front surface 230a of the main frame 230 and the guide plate 211. The guide plate 211 may face the front surface 230a of the main frame 230. The guide plate 211 and the front surface 230a of the main frame 230 may be separated as much as at least the thickness of the spacer 211a. The guide wall 212c of the guide mount 212 may be in contact with the front surface 230a of the main frame 230. The front coupling plate 222c of the circulating fan mount 222 may be in contact with the front surface 230a of the main frame 230.

The front coupling plate 222c of the circulating fan mount 222 can be fastened to the front surface 230a of the main frame 230. The front coupling plate 222c of the circulating fan mount 222 and the front surface 230a of the main frame 230 can be fastened by the fastening member.

The rear coupling plate 222d of the circulating fan mount 222 can be fastened to the rear surface 230b of the main frame 230. The rear coupling plate 222d of the circulating fan mount 222 can be fastened to an upper part of the rear surface 230b of the main frame 230. The rear coupling plate 222d of the circulating fan mount 222 and the upper part of the rear surface 230b of the main frame 230 can be fastened by the fastening member.

The circulating fan mount 222 is fastened to the main frame 230, and then the front surface 230a, the lateral surface and the upper part of the rear surface 230b of the circulating fan mount 222 and the main frame 230 may form a space S3. The flow or fluid introduced from the lower portion of the circulating fan mount 222 may pass through the space S3 formed by the circulating fan mount 222 and the main frame 230, and may be discharged into the first circulating duct 271.

The second guide bracket 253 can be fastened to the lower surface 230f of the main frame 230. The second guide bracket 253 has an upper coupling surface 253a coupled with the main frame 230, a lower coupling surface 253b coupled with the discharging fan mount 252, and an inclined surface 253c connecting the upper coupling surface 253a and the lower coupling surface 253b. The upper coupling surface 253a of the second guide bracket 253 can be fastened to the lower surface 230f of the main frame 230 by the fastening member.

The discharging fan mount 252 can be fastened to the second guide bracket 253. The discharging fan mount 252 can be fastened to the lower engaging surface 253b of the second guide bracket 253 by the fastening member. The discharging fan mount 252 may have a shape of a plate. The discharging fan mount 252 may have a rectangular parallelepiped shape. The discharging fan mount 252 may have a hollow rectangular parallelepiped shape.

The discharging fan mount 252 may include a discharge port. The discharging fan 251 can be fastened to the discharging fan mount 252. The discharging fan 251 may face the discharge port. The discharging fan 251 may be an axial flow fan.

The discharging fan 251 may be referred to as a first fan. The discharging fan mount 252 may be referred to as a first mount.

A plurality of discharge ports may be formed in the discharging fan mount 252. The discharge ports may be spaced apart from each other. A plurality of discharging fans 251 may be provided corresponding to the discharge ports. In case that the second guide bracket 253 and the discharging fan mount 252 are engaged, the discharge port may face the inclined surface 253c of the second guide bracket 253.

The fastening portion 260 can be fastened to the lower surface 230f of the main frame 230. The fastening portion 260 may have a rectangular parallelepiped shape. Alternatively, the fastening portion 260 may have a hollow rectangular parallelepiped shape. The fastening portion 260 can be fastened to the lower surface 230f of the main frame 230 by fastening member. The front surface of the coupling portion 260 and the front surface 230a of the main frame 230 may be positioned on the same plane in case that the coupling portion 260 is fastened to the main frame 230.

The fastening portions 260 may be formed in plural. The fastening portions 260 may include a left fastening portion 260 and a right fastening portion 260. The left fastening portion 260 and the right fastening portion 260 may be spaced apart from each other. The left surface of the left fastening portion 260 and the left surface of the main frame 230 may be positioned on the same plane. The right surface of the right fastening portion 260 and the right surface 230i of the main frame 230 may be positioned on the same plane. The discharging fan mount 252 may be disposed between the left fastening portion 260 and the right fastening portion 260. The second guide bracket 253 may be disposed between the left fastening portion 260 and the right fastening portion 260.

Figure 18:
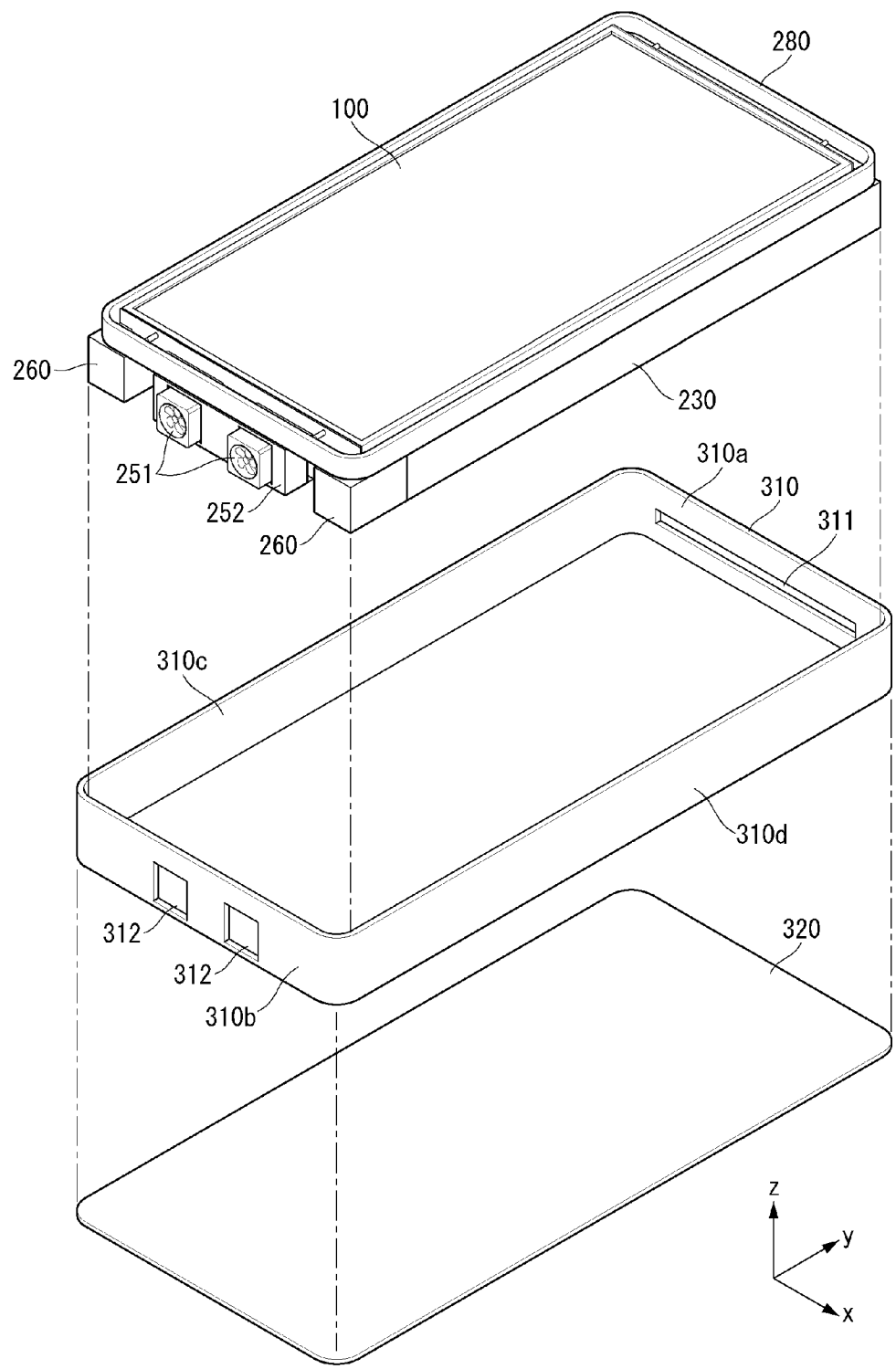

The main frame 230 can be received in the housing 310 (see FIG. 18). The main frame 230 may be fastened to the housing 310. The housing 310 will be described later. The discharging fan mount 252 and the second guide bracket 253 may be disposed between the lower surface 230f of the main frame 230 and the lower surface 310b of the housing 310. The fastening portion 260 may be disposed between the lower surface 230f of the main frame 230 and the lower surface 310b of the housing 310. The upper surface of the coupling portion 260 can be fastened to the lower surface 230f of the main frame 230. The lower surface of the fastening portion 260 can be fastened to the lower surface 310b of the housing 310. The main frame 230 may be fastened to the housing 310 by the fastening portion 260.

The first circulating duct 271 may be connected to the fourth holes 231 of the main frame 230. The first circulating duct 271 may be formed in plural. The first circulating ducts 271 may be formed in a plurality corresponding to the fourth holes 231. The flow or fluid discharged from the circulating fan 221 can flow along the first circulating duct 271. The first circulating duct 271 may be made of a material having elasticity.

The first circulating duct 271 may include a flow path portion 271a and a space portion 271b formed on the outer circumference of the flow path portion 271a. The space portion 271b can separate the main frame 230 from and the seating plate 280. The seating plate 280 will be described later.

The second circulating duct 272 may be connected to the fifth holes 232 of the main frame 230. The second circulating ducts 272 may be formed in plural. The second circulating ducts 272 may be formed in a plurality corresponding to the fifth holes 232. The flow or fluid into the circulating fan 221 may flow along the second circulating duct 272.

The second circulating duct 272 may include a rear surface 272a formed with a hole 272d and a flow path portion 272b protruding forwardly around the hole 272d. The rear surface 272a of the second circulating duct 272 can be fastened to the front surface 230a of the main frame 230. The rear surface 272a of the second circulating duct 272 can be fastened to the front surface 230a of the main frame 230 by the fastening member. The rear surface 272a of the second circulating duct 272 can be fastened to the front surface of the fastening portion 260. The rear surface 272a of the second circulation duct 272 can be fastened to the front surface of the fastening portion 260 by the fastening member. A portion of the rear surface 272a of the second circulating duct 272 can be fastened to the front surface 230a of the main frame 230. The other portion of the rear surface 272a of the second circulating duct 272 can be fastened to the front surface of the fastening portion 260.

The holes 272d of the second circulating duct 272 may be disposed opposite to the fifth holes 232 of the main frame 230. The holes 272d of the second circulating duct 272 may be formed to be greater than the fifth holes 232 of the main frame 230.

The second circulating duct 272 may further include a flange 272c formed at the front end of the flow path portion 271b. The flange 272c can be fastened to the seating plate 280. The flange 272c of the second circulating duct 272 can be fastened to the seating plate 280 by the fastening member. The second circulating duct 272 can separate the main frame 230 from the seating plate 280. A description of the seating plate 280 will be given later.

The wiring duct 273 may be connected to the sixth holes 233 of the main frame 230. The wiring ducts 273 may be formed in plural. The plurality of wiring ducts 273 may be corresponding to the sixth holes 233. The wiring connecting the display module 100 and the electronic components to be fastened to the guide plate 211 can pass through the wiring duct 273. The wiring duct 273 may be made of a material having elasticity.

The wiring duct 273 may include a flow path portion 273a and a space portion 273b formed on the outer circumference of the flow path portion 273a. The space portion 273b can separate the main frame 230 from the seating plate 280. The seating plate 280 will be described later.

The first circulating duct 271 may be referred to as a first duct. The second circulating duct 272 may be referred to as a second duct. The wiring duct 273 can be referred to as a third duct.

Figure 16:
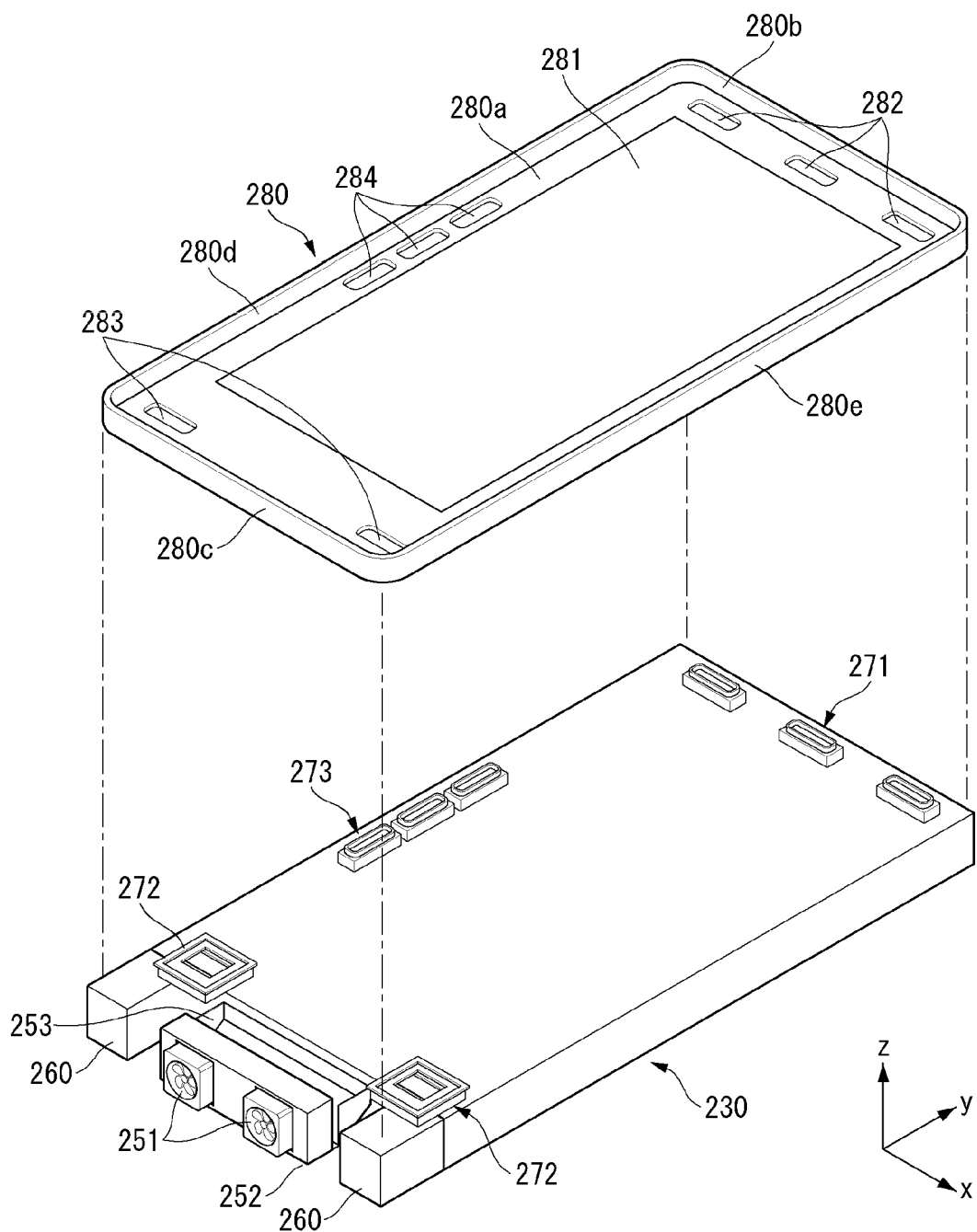

Referring to FIG. 16, the seating plate 280 may be fastened to the main frame 230. The seating plate 280 may be referred to as a plate. The seating plate 280 may include a seating surface 280a, an upper surface 280b, a lower surface 280c, and a lateral surface 280d and 280e. The lateral surface 280d and 280e may include a left surface 280d and a right surface 280e. The upper surface 280b of the seating plate 280 may be formed by projecting the upper portion of the seating surface 280a forward of the seating plate 280. The lower surface 280c of the seating plate 280 may be formed by projecting the lower portion of the seating surface 280a forward of the seating plate 280. The left surface 280d of the seating plate 280 may be formed by projecting the left portion of the seating surface 280a forward of the seating plate 280. The right side 280e of the seating plate 280 may be formed by projecting the right portion of the seating surface 280a forward of the seating plate 280.

The seating surface 280a, the upper surface 280b, the lower surface 280c, and the lateral surface 280d and 280e of the seating plate 280 can form an accommodating space. The display module 100 may be accommodated in the accommodating space formed by the seating plate 280.

The seating plate 280 can partition the inner space formed by the housing 310 into a front space and a rear space. The heat dissipating hole 281 can connect or communicate the front space and the rear space. The main frame 230 may provide space therein. The inner space provided by the main frame 230 may be referred to as a second inner space. The main frame 230 may partition the rear space into the intermediate space and the second inner space.

The seating surface 280a of the seating plate 280 may be spaced apart from the front surface 230a of the main frame 230. The space portion 271b of the first circulating duct 271 may be positioned between the seating surface 280a of the seating plate 280 and the front surface 230a of the main frame 230. The second circulating duct 272 may be positioned between the seating surface 280a of the seating plate 280 and the front surface 230a of the main frame 230. The seating surface 280a of the seating plate 280 and the front surface 230a of the main frame 230 may be spaced apart from each other by a length of the space portion 271b of the first circulating duct 271 in the z direction. The seating surface 280a of the seating plate 280 and the front surface 230a of the main frame 230 may be spaced apart from each other by the length of the second circulating duct 272.

The seating plate 280 may include a plurality of holes at the seating surface 280a. For example, the seating plate 280 may include a first hole 282 formed on the seating surface 280a. The first holes 282 of the seating plate 280 may be formed in plural along an edge of the seating surface 280a. The first holes 282 of the seating plate 280 may be disposed to face the fourth holes 231 of the main frame 230. The first holes 282 of the seating plate 280 may be formed in a plurality corresponding to the number of the fourth holes 231 of the main frame 230.

The first circulating duct 271 may be connected to the first hole 282 of the seating plate 280. The first holes 282 of the seating plate 280 may be formed in plurality corresponding to the number of the first circulating ducts 271. The first circulating duct 271 can connect the first hole 282 of the seating plate 280 and the fourth hole 231 of the main frame 230. The flow or fluid discharged from the circulating fan 221 can pass through the fourth hole 231 of the main frame 230, the first circulating duct 271 and the first hole 282 of the seating plate 280. The flow or fluid discharged from the circulating fan 221 can flow forward of the seating surface 280a of the seating plate 280.

The seating plate 280 may include a second hole 283 formed at the lower portion of the seating surface 280a. The second holes 283 of the seating plate 280 may be formed in plural along an edge of the seating surface 280a. The second hole 283 of the seating plate 280 may be disposed to face the fifth hole 232 of the main frame 230. The second holes 283 of the seating plate 280 may be formed in plurality corresponding to the number of the fifth holes 232 of the main frame 230.

The second circulating duct 272 may be connected to the second hole 283 of the seating plate 280. The second holes 283 of the seating plate 280 may be formed in plurality corresponding to the number of the second circulating ducts 272. The second circulating duct 272 can connect the second hole 283 of the seating plate 280 and the fifth hole 232 of the main frame 230. The flow or fluid into the circulating fan 221 can pass through the fifth hole 232 of the main frame 230, the second circulating duct 272, and the second hole 283 of the seating plate 280. The flow or fluid entering the circulating fan 221 can flow into the rear of the seating surface 280a of the seating plate 280.

The seating plate 280 may include a third hole 284 formed on the seating surface 280a. The third holes 284 of the seating plate 280 may be formed in plural along an edge of the seating surface 280a. The third hole 284 of the seating plate 280 may be disposed to face the sixth hole 233 of the main frame 230. The third holes 284 of the seating plate 280 may be formed in plurality corresponding to the number of the sixth holes 233 of the main frame 230.

The wiring duct 273 may be connected to the third hole 284 of the seating plate 280. The third holes 284 of the seating plate 280 may be formed in plurality corresponding to the number of the wiring ducts 273. The wiring duct 273 can connect the third hole 284 of the seating plate 280 and the sixth hole 233 of the main frame 230. The wiring connecting the display module 100 and the electronic components fastened to the guide plate 211 may pass through the third hole 284 of the seating plate 280, the wiring duct 273, and the sixth hole 233 of the main frame 230.

The seating plate 280 may include an opening 281 formed at the seating surface 280a. The opening 281 can be referred to as a heat dissipating hole 281. The heat dissipating hole 281 may be located at the center of the seating surface 280a. The heat dissipating hole 281 may be spaced downward from the first hole 282 of the seating plate 280. The heat dissipating hole 281 may be spaced upward from the second hole 283 of the seating plate 280. The heat dissipating hole 281 may be spaced apart from the third hole 284 of the seating plate 280. The heat dissipating hole 281 may be located between the first hole 283 of the seating plate 280 and the second hole 283 of the seating plate 280.

The main frame 230 may be coupled with components such as a guide plate 211, a guide mount 212, a seating plate 280, a circulating fan 221 or a discharging fan 251. In case that the main frame 230 is combined with those components, the main frame 230 and those components may be referred to as a main frame assembly as a whole.

Figure 17:
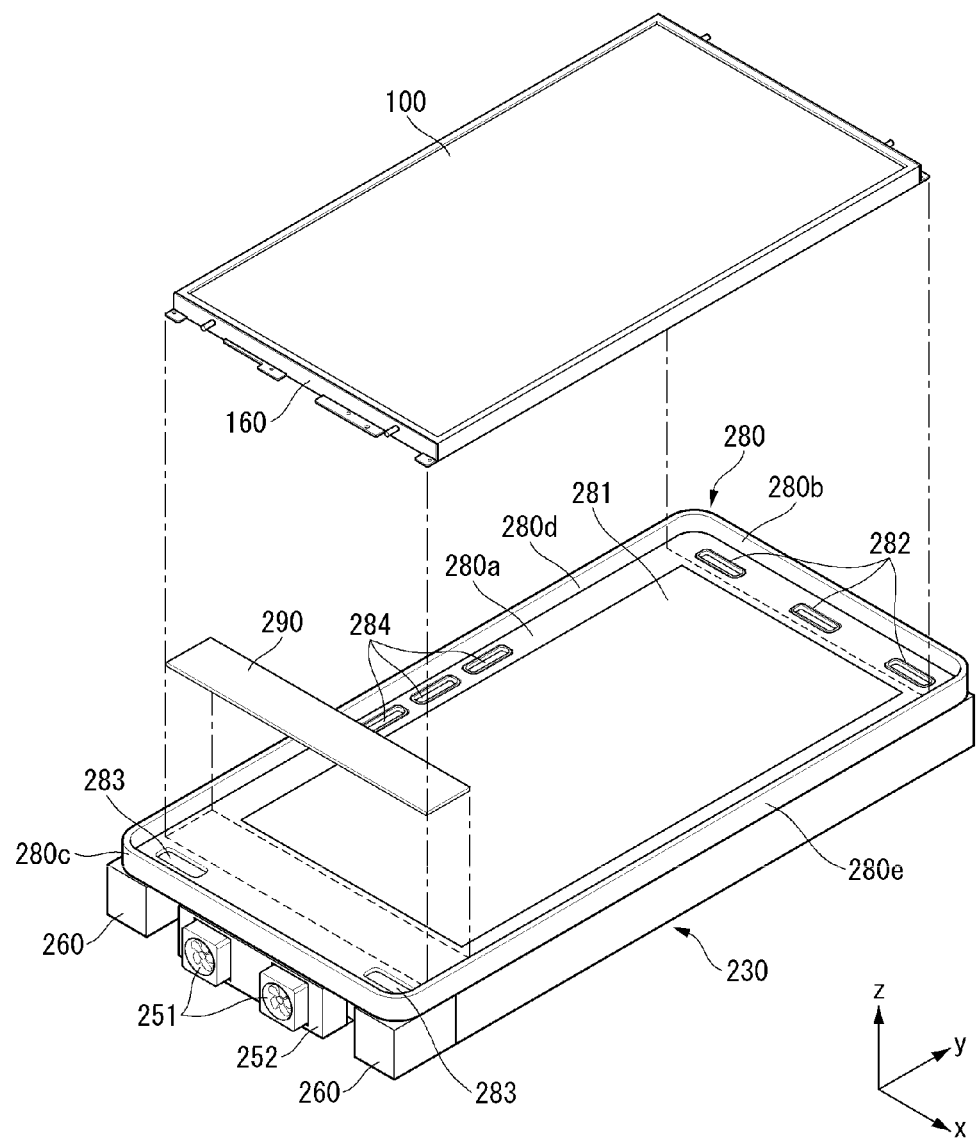

Referring to FIG. 17, the display module 100 may be fastened to the seating plate 280. The display module 100 may be fastened to the main frame assembly 230. The module assembly may be fastened to the seating plate 280. The module assembly may be fastened to the main frame assembly.

In case that the display module 100 is fastened to the seating plate 280, the rear surface of the display module 100 may contact the seating surface 280a. The rear surface of the display module 100 may be positioned to face the seating plate 280. The rear surface of the display module 100 may be positioned to face the front surface 230a of the main frame 230.

The display module 100 may be spaced downward from the first hole 282 of the seating plate 280. The display module 100 may be spaced upward from the second hole 283 of the seating plate 280. The display module 100 may be spaced apart from the third hole 284 of the seating plate 280. The display module 100 may be positioned between the first hole 282 and the second hole 283 of the seating plate 280.

A pair of brackets 160 fastened to the display module 100 can be coupled with the seating plate 280. The bracket 160 can be fastened to the seating surface 280a of the seating plate 280. The display module 100 can be coupled with the seating plate 280 by fastening the bracket 160 to the seating plate 280. The bracket 160 can be fastened to the seating plate 280 by the fastening member.

The conventional display device has been configured to be assembled by fastening the components of the display module 100 to the seating plate 280 one by one. However, this conventional method has a disadvantage in that the assembly is very complicated and difficult. In addition, there has been an inconvenience in disassembling all the components to check the display module 100 at the time of maintenance or repair of the display device.

However, according to the present invention, the display module 100 is configured to be fastened to the seating plate 280 by the bracket 160, thereby simplifying the assembly of the display device. In addition, it is possible to separate only the display module 100 in order to check the display module 100, which is advantageous in that maintenance or repair is simplified.

The display module 100 may cover the heat dissipating hole 281 of the seating plate 280. The first region S1 on the rear surface of the display module 100 may face the heat dissipating hole 281. The area of the heat dissipating hole 281 may be substantially same as the area of the first region S1 on the rear surface of the display module 100. A part of the sealing frame 140 can be inserted into the heat dissipating hole 281. The sealing frame 140 may be in contact with the circumference of the heat dissipating hole 281. The sealing frame 140 may be in contact with the seating surface 280a around the heat dissipating hole 281.

The rear surface of the display module 100 may be spaced apart from the seating surface 280a of the seating plate 280. A portion of the sealing frame 140 may be positioned between the rear surface of the display module 100 and the seating surface 280a of the seating plate 280. The heat transferring pad 290 may be positioned between the second region S2 on the rear surface of the display module 100 and the seating surface 280a of the seating plate 280.

The heat transferring pad 290 may be disposed below the seating surface 280a of the seating plate 280. The heat transferring pad 290 may be disposed between the second hole 283 of the seating surface 280a and the heat dissipating hole 281. The heat transferring pad 290 may be disposed on the lower portion of the rear surface of the display module 100. The heat transferring pad 290 may be disposed on the rear surface of the display module 100 and spaced below the sealing frame 140.

The heat transferring pad 290 may transmit heat generated from the second region S2 on the rear surface of the display module 100 to the seating surface 280a. The heat transferring pad 290 may be made of a material having a high thermal conductivity. The heat transferring pad 290 may be referred to as a heat conduction pad 290.

Figure 19:
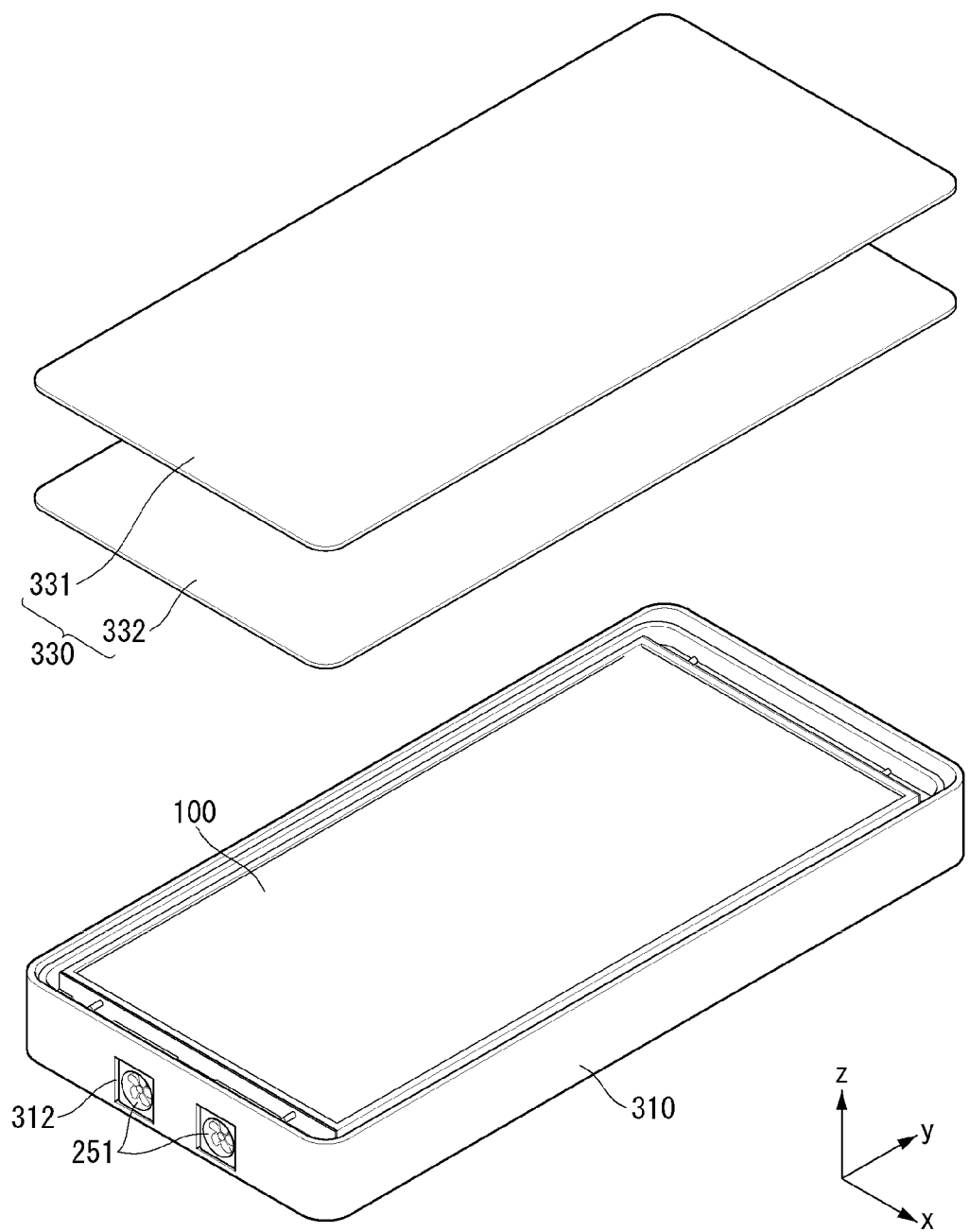
Figure 20:
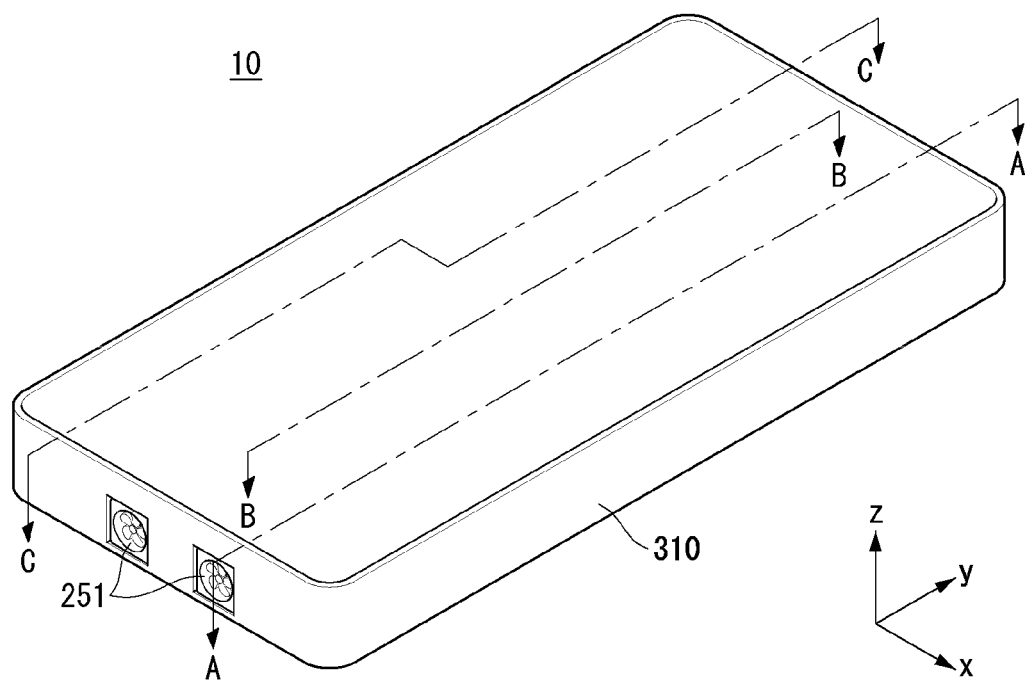
FIGS. 20 to 24 are views showing examples of the heat dissipation structure of a display device according to an embodiment of the present invention.
Figure 21:
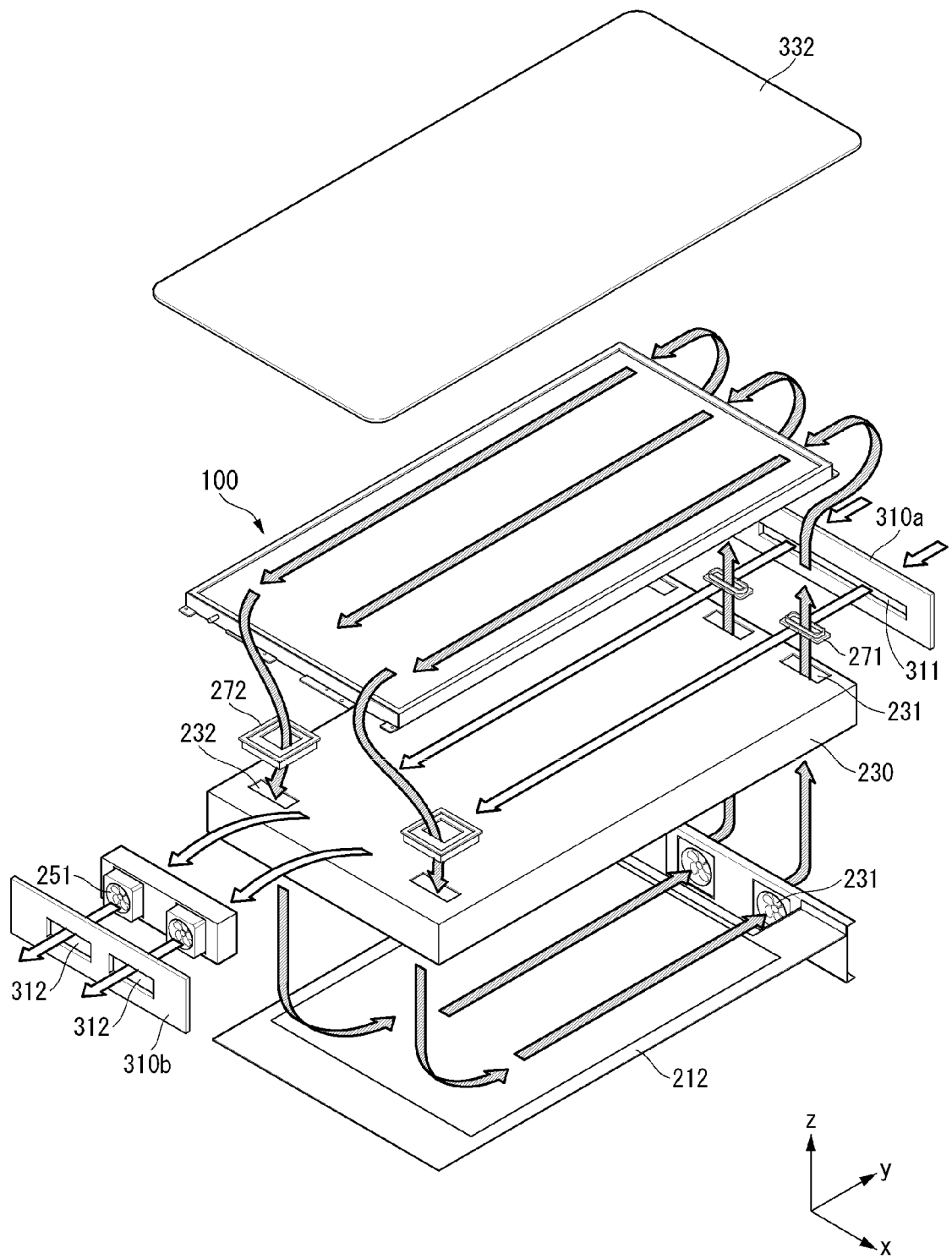
Figure 22:
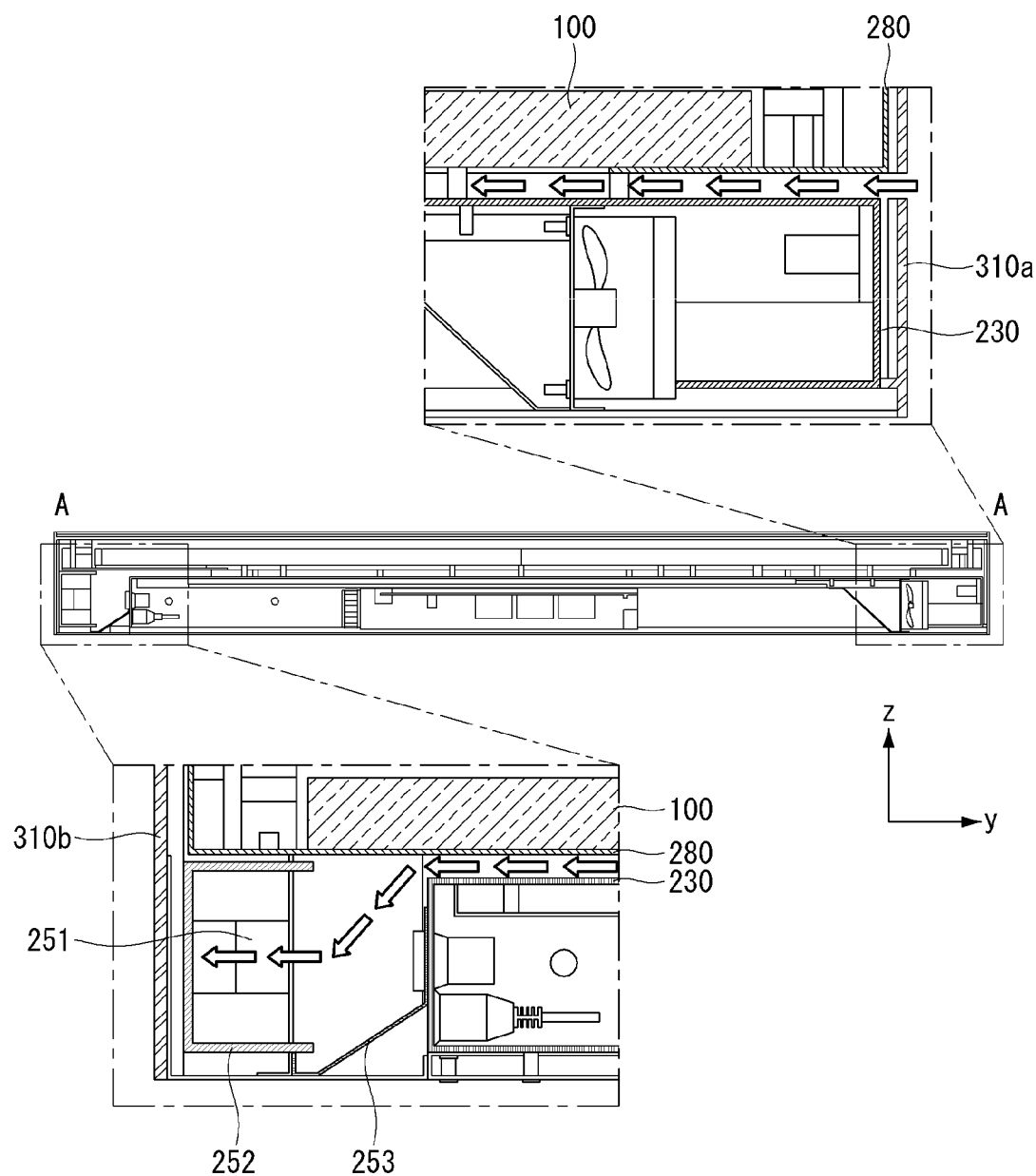
Figure 23:
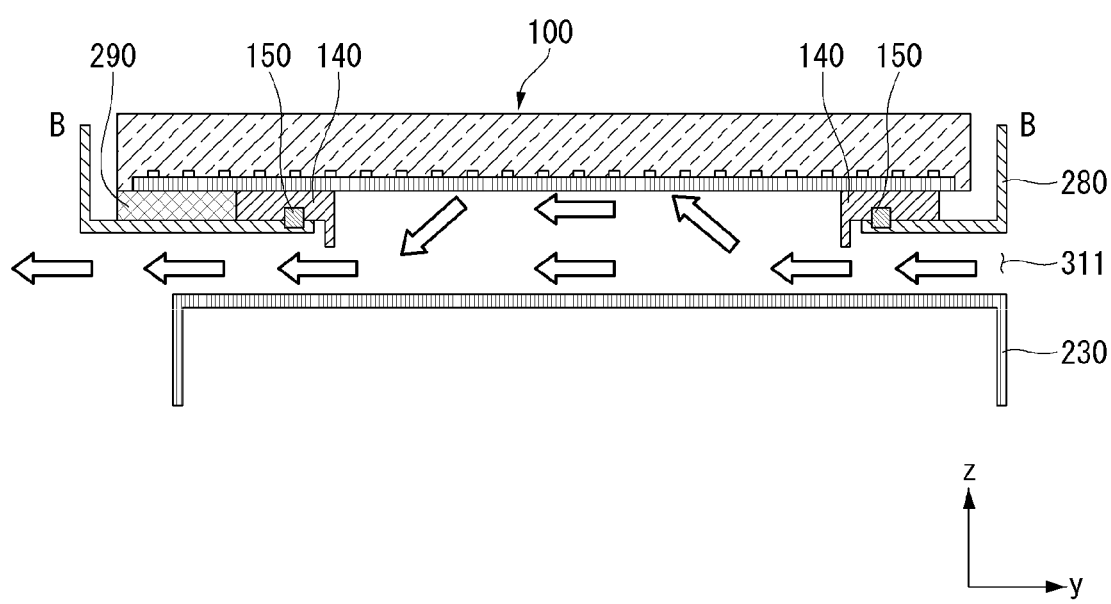
Figure 24:
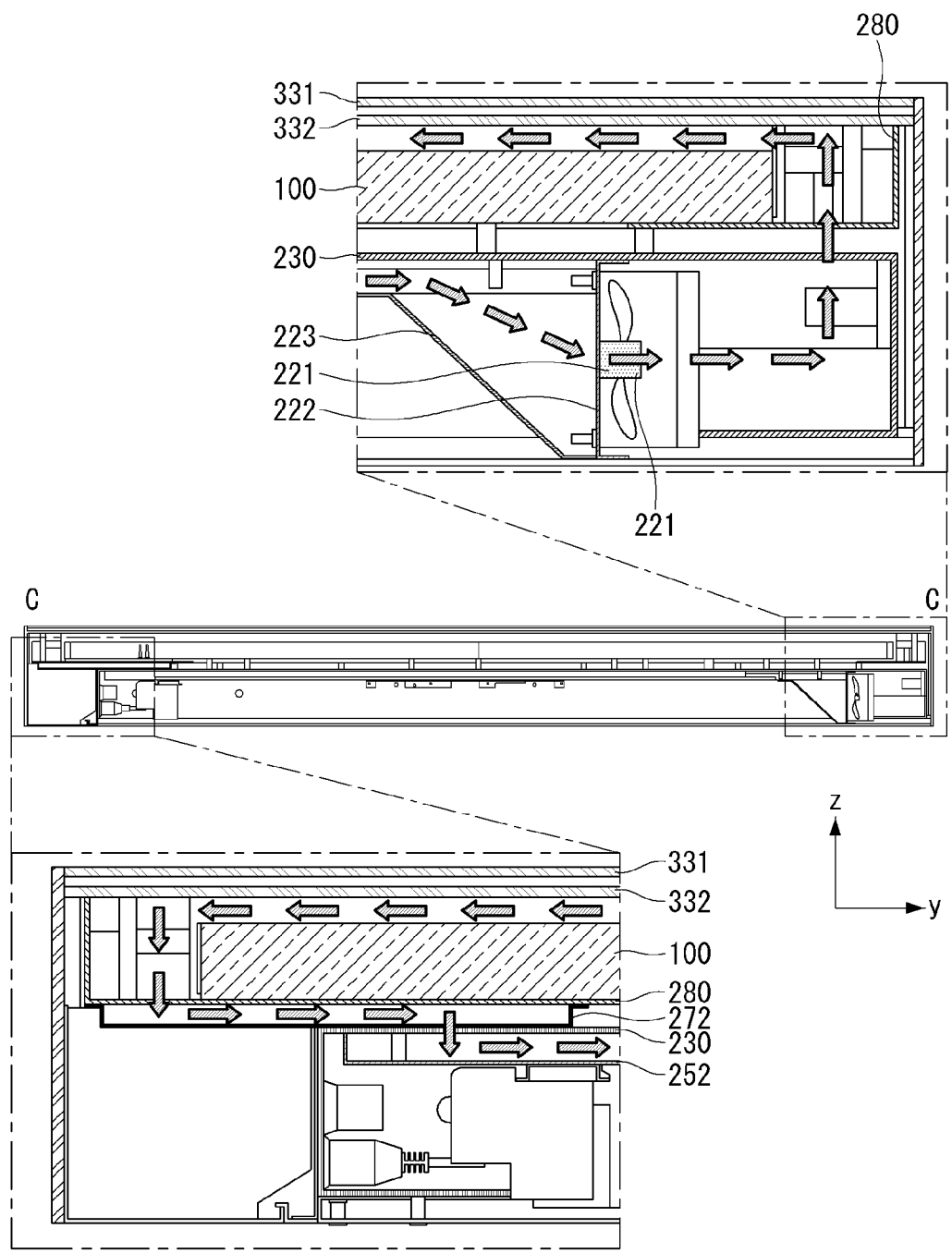

Referring to FIGS. 18 and 19, the main frame 230 may be coupled with the housing 310. The housing 310 may have a upper surface 310a and a lower surface 310b and a lateral surface 310c and 310d. The housing 310 may be open forward and rearward. The lateral surface 310c and 310d of the housing 310 may include a left surface 310c and a right surface 310d.

The housing 310 may include an inlet opening 311 formed at the upper surface 310a of the housing 310. The inlet opening 311 may be elongated along an edge of the upper surface 310a of the housing 310. The inlet opening 311 may be formed in plural along the edge of the upper surface 310a of the housing 310. The outside air can be introduced into the housing 310 through the inlet opening 311. The inlet opening 311 may be referred to as an inlet 311.

The housing 310 may include a discharge opening 312 formed at the lower surface 310b of the housing 310. The discharge opening 312 may be elongated along an edge of the lower surface 310b of the housing 310. The discharge openings 312 may be formed in plural along the edge of the upper surface 310a of the housing 310. The outside air introduced into the housing 310 can be discharged to the outside of the housing 310 through the discharge opening 312. A plurality of discharge openings 312 of the housing 310 may be provided corresponding to the discharging fans 251. The discharge opening 312 may be referred to as an outlet 312.

In case that the discharging fan 251 is disposed close to the inlet opening 311, the discharging fan 251 can be referred to as an intake fan 251.

The housing 310 may further include an outer plate 320 coupled to a rear surface of the housing 310. The rear surface of the housing 310 may be an outer plate 320. The outer plate 320 can be coupled with the housing 310 by the fastening member. The outer plate 320 may cover the rear surface of the housing 310. The housing 310 fastened to the outer plate 320 may form an accommodating space. The main frame assembly can be received in the accommodating space formed by the outer plate 320 and the housing 310.

The outer plate 320 can be coupled with or separated from the rear surface of the housing 310. Upon maintenance or repair of the display device, the service provider may detach the outer plate 320 from the rear surface of the housing 310.

The main frame assembly coupled with the module assembly can be fastened to the housing 310. The upper surface of the main frame 230 may be coupled with the upper surface 310a of the housing 310. The upper surface of the main frame 230 may be coupled with the upper surface 310a of the housing 310 by the fastening member. The lower surface 230f of the main frame 230 can be coupled with the lower surface 310b of the housing 310. The lower surface 230f of the main frame 230 can be coupled with the lower surface 310b of the housing 310 by the fastening member. The lateral surface of the main frame 230 can be coupled with the lateral surface of the housing 310. The lateral surface of the main frame 230 can be coupled with the lateral surface of the housing 310 by the fastening member. The rear surface 230b of the main frame 230 may be coupled with the rear surface of the housing 310. The rear surface 230b of the main frame 230 may be coupled with the rear surface of the housing 310 by the fastening member.

The fastening portion 260 can be coupled with the lower surface 310b of the housing 310. The fastening portion 260 can be coupled with the lower surface 230f of the main frame 230. The fastening portion 260 can be coupled with the lower surface 310b of the housing 310 by the fastening member.

The discharging fan mount 252 can be coupled with the lower surface 310b of the housing 310. The discharging fan mount 252 can be coupled with the lower surface 310b of the housing 310 by the fastening member. In case that the discharging fan mount 252 and the housing 310 are coupled to each other, the discharge port of the discharging fan mount 252 and the discharge opening 312 of the housing 310 may be disposed opposite to each other. The outside air introduced into the housing 310 may be discharged to the outside of the housing through the discharge opening 312 of the housing 310 by the discharge fan 251.

The glass 330 may be coupled with a front side of the display module 100. The glass 330 may include an inner glass 332 and an outer glass 331. The inner glass 332 can be coupled with the front surface of the housing 310. The inner glass 332 may be disposed to face the front surface of the display module 100. The inner glass 332 may be spaced apart from the front surface of the display module 100. A gap may be formed between the inner glass 332 and the front surface of the display module 100.

The outer glass 331 may be coupled with the front surface of the housing 310. The outer glass 331 may form an appearance of the front side of the display device. The outer glass 331 may be spaced apart from the inner glass 332. The inner glass 332 may be disposed between the outer glass 331 and the display module 100.

Referring to FIGS. 20 to 24, the display device may include a cooling passage or may form the cooling passage. The cooling passage may include an outside air passage and a circulation passage. The arrows that are not painted inside the arrows can represent the flow of fluid at the outside air passage. In addition, the colored arrows inside the arrows can represent the flow of fluid at the circulation passage.

The outside air can flow along the outside air passage. The discharging fan 251 can introduce the outside air into the inside of the display device. The discharging fan 251 can discharge the outside air to the outside of the display device. The outside air can be introduced into the device through an inlet opening 311 formed at the upper surface 310a of the housing 310.

The height from the outer plate 320 to the inlet opening 311 formed at the housing 310 may be greater than the height from the outer plate 320 to the front surface 230a of the main frame 230. The upper surface of the main frame 230 may be disposed in contact with the upper surface 310a of the housing 310. Therefore, the height from the outer plate 320 to the inlet opening formed at the housing 310 must be greater than the height from the outer plate 320 to the front surface 230a of the main frame 230 so that the outside air can flow smoothly.

The outside air introduced through the inlet opening 311 of the housing 310 may flow between the main frame 230 and the seating plate 280. The main frame 230 and the seating plate 280 may be spaced apart from each other. The space portion 271b of the first circulating duct 271 may be positioned between the front surface 230a of the main frame 230 and the seating surface 280a of the seating plate 280. The space portion 271b of the first circulating duct 271 may cause the plate 280 to be spaced apart from the seating plate 280. The space portion 273b of the wiring duct 273 can be positioned between the front surface 230a of the main frame 230 and the seating surface 280a of the seating plate 280. The space portion 273b of the wiring duct 273 may cause the main frame 230 to be spaced apart from the seating plate 280. The second circulating duct 272 may be positioned between the front surface 230a of the main frame 230 and the seating surface 280a of the seating plate 280. The second circulating duct 272 may cause the main frame 230 to be spaced apart from the seating plate 280.

The outside air introduced through the inlet opening 311 of the housing 310 may flow between the main frame 230 and the display module 100. The seating plate 280 may be spaced apart from the main frame 230. The display module 100 may be coupled with the seating surface 280a of the seating plate 280. Accordingly, the display module 100 may be spaced apart from the main frame 230.

The region on the rear surface of the display module 100 exposed through the heat dissipating hole 281 of the seating plate 280, can be in direct contact with the outside air. The region on the rear surface of the display module 100 exposed through the heat dissipating hole 281 of the seating plate 280, can directly perform heat exchange with the outside air.

The first region S1 on the rear surface of the display module 100 can be in direct contact with the outside air. The first region S1 on the rear surface of the display module 100 can perform heat exchange directly with the outside air.

The outside air may contain foreign matter such as moisture or dust. In case that outside air penetrates between the display module 100 and the seating plate 280, the display module 100 may have relatively high probability of damage. Therefore, a structure for preventing the outside air from penetrating between the display module 100 and the seating plate 280 may be needed.

The sealing frame 140 can be coupled with the rear surface of the display module 100 and prevent the outside air from penetrating between the display module 100 and the seating plate 280. The gasket 150 may be coupled to the sealing frame 140 and may be positioned between the sealing frame 140 and the seating plate 280. The gasket 150 can prevent the outside air from penetrating between the display module 100 and the seating plate 280. The gasket 150 and the sealing frame 140 can form a double waterproof and dustproof structure.

The heat transferring pad 290 may contact both the second region S2 on the rear surface of the display module 100 and the seating surface 280a of the seating plate 280. The heat transferring pad 290 can transfer heat generated from the second region S2 on the rear surface of the display module 100 to the seating plate 280. The seating surface 280a of the seating plate 280 may be in direct contact with the outside air and perform heat exchange with the outside air. The heat transferred to the seating surface 280a of the seating plate 280 may be carried to the outside air.

The outside air exchanges heat with both the second region S2 of the rear surface of the display module 100 and the seating surface 280a of the seating plate 280 and then may flow between the lower portion of the seating plate 280 and the lower portion of the main frame 230. The outside air can be guided to the discharging fan 251 along the inclined surface 253c of the second guide bracket 253. The discharging fan 251 can discharge the outside air to the outside of the display device through the discharge opening 312 of the housing 310.

The inlet opening 311, the space between the seating plate 280 and the main frame 230, the space between the display module 100 and the main frame 230, the second guide bracket 253, and the discharge opening 312 may form the outside air passage.

The outside air passage may be an opened passage through which the outside air flows into the display device and is discharged to the outside of the display device.

The circulation passage may be a passage through which the air inside the display device circulates. The air circulated inside the display device can be referred to as an inside air. The circulating fan 221 can circulate the inside air. The inside air can be introduced into the first circulating duct 271 through the circulating fan 221.

The inside air can be discharged to the upper side of the display module 100 through the first circulating duct 271. The discharged air to the upper side of the display module 100 can flow between the front surface of the display module 100 and the inner glass 332. The display module 100 and the inner glass 332 may be spaced apart from each other.

The inside air may be in direct contact with the front surface of the display module 100. The inside air may exchange heat with the display module 100 directly. The inside air can flow along the front surface of the display module 100.

The inside air can flow downward of the display module 100 along the display module 100. The inside air can be introduced into the second circulating duct 272.

The inside air can be discharged into between the front surface 230a of the main frame 230 and the guide plate 211 through the second circulating duct 272. The inside air can be discharged into between the front surface 230a of the main frame 230 and the guide mount 212 through the second circulating duct 272.

The guide plate 211 may be spaced apart from the front surface 230a of the main frame 230. The spacer 213 may be disposed between the guide plate 211 and the front surface 230a of the main frame 230 and may cause the guide plate 211 to be spaced apart from the front surface 230a of the main frame 230. The guide mount 212 may be spaced apart from the front surface 230a of the main frame 230.

The inside air can flow along the guide plate 211 or the guide mount 212. The inside air can be guided toward the circulating fan 221 along the inclined surface 223c of the first guide bracket 223.

The circulation passage may be formed by the main frame 230, the guide plate 211, the guide mount 212, the first circulating duct 271, the seating plate 280, the display module 100, the inner glass 332, and the second circulating duct 272.

The circulation passage may be a closed passage in which the inside air circulates.

The inside air may be blocked from flowing into the outside air passage. The outside air may be blocked from flowing into the circulation passage. The outside air passage and the circulation passage may function as independent air passages which are distinguished from each other.

The circulation passage and the outside air passage can be distinguished by the front surface 230a of the main frame 230. The outside air can flow in front of the front surface 230a of the main frame 230 and the inside air can flow behind the front surface 230a of the main frame 230. The outside air can flow from the upper portion of the front surface 230a of the main frame 230 to the lower portion of the front surface 230a of the main frame 230, and the inside air can flow from the lower portion of the front surface 230a of the main frame 230 to the upper portion of the front surface 230a of the main frame 230. The outside air and the inside air can flow along each side of the front surface 230a of the main frame 230 respectively as a counterflow with respect to each other. The outside air and the inside air can mutually exchange heat through the medium of the front surface 230a of the main frame 230. In case that the temperature of the inside air is high and the temperature of the outside air is low, the outside air may lower the temperature of the inside air.

The foregoing embodiments are merely examples and are not to be considered as limiting the present disclosure. The present teachings can be readily applied to other types of methods and apparatuses. The features, structures, methods, and other characteristics of the embodiments described herein may be combined in various ways to obtain additional and/or alternative embodiments.

Certain embodiments or other embodiments of the invention described above are not mutually exclusive or distinct from each other. Any or all elements of the embodiments of the invention described above may be combined or combined with each other in configuration or function.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a housing defining an interior space;
   a plate positioned to divide the interior space into a front space and a rear space, wherein the plate comprises an opening between the front space and the rear space;
   a display module disposed at the front space and mounted to the plate to cover the opening;
   a main frame disposed at the rear space, wherein the main frame divides the rear space into a second inner space behind the main frame and an intermediate space between the plate and the main frame;
   a duct disposed at the intermediate space and configured to permit air flow between the intermediate space and the second inner space;
   a first fan positioned at the rear space; and
   a glass disposed at a front side of the housing,
   wherein the first fan is positioned in the intermediate space,
   wherein the plate includes a first hole and a second hole permitting air flow between the front space and the intermediate space,
   wherein the main frame comprises:
      a fourth hole and a fifth hole permitting air flow between the second inner space and the intermediate space;
      a first duct between the first hole and the fourth hole;
      a second duct between the second hole and the fifth hole; and
      a second fan positioned in the second inner space, and
   wherein the housing comprises an inlet opening and an outlet opening configured to permit air flow between the intermediate space and an exterior of the housing.

2. The display device of claim 1, further comprising a first mount coupled to a lower portion of the main frame and positioned to face the outlet opening, wherein the first fan is coupled to the first mount.

3. The display device of claim 1, wherein the main frame disposed at the rear space and spaced apart from the plate defining a gap therebetween,
   wherein the inlet opening is adjacent to an upper portion of the main frame and permits air flow between the gap and an exterior of the housing.

4. The display device of claim 1, further comprising:
   a sealing frame between the display module and the plate, wherein the sealing frame surrounds a heat exchange region of the display module which faces the opening.

5. The display device of claim 4, further comprising a gasket between the sealing frame and the plate.

6. The display device of claim 4, wherein the display module comprises:
   a pem nut fastened to the heat exchange region and the sealing frame; and
   a sealing member positioned around the pem nut.

7. The display device of claim 4, further comprising a heat transferring pad between the display module and the plate and disposed to contact a portion of the rear surface of the display module outside of the sealing frame.

8. The display device of claim 1, further comprising a bracket coupled with the display module and the plate, and disposed at an upper side or lower side of the display module.

9. The display device of claim 1, wherein the first hole of the plate is located at an upper side of the display module and the second hole of the plate is located at a lower side of the display module, and the display module is positioned between the first hole and the second hole.

10. The display device of claim 9, wherein the plate comprises a plurality of the first hole and a plurality of the second hole.

11. The display device of claim 1, wherein:
    the plate further comprises a third hole;
    the main frame further comprises a sixth hole;
    the display device further comprises a power supply unit mounted on the main frame; and
    at least one wire connecting the power supply unit to the display module is passed through the sixth hole and the third hole via a third duct.

* * * * *